(12) United States Patent
Devanney et al.

(10) Patent No.: US 6,763,406 B1
(45) Date of Patent: Jul. 13, 2004

(54) NOISE REDUCTION SYSTEM AND METHOD FOR REDUCING SWITCHING NOISE IN AN INTERFACE TO A LARGE WIDTH BUS

(75) Inventors: William L. Devanney, Menlo Park, CA (US); Robert J. Proebsting, Los Altos Hills, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 491 days.

(21) Appl. No.: 09/775,428

(22) Filed: Feb. 1, 2001

Related U.S. Application Data

(62) Division of application No. 08/755,542, filed on Nov. 21, 1996, now Pat. No. 6,243,779.

(51) Int. Cl.[7] ............................................. G06F 13/12
(52) U.S. Cl. ........................... 710/65; 710/33; 709/246; 712/223
(58) Field of Search .......................... 710/1, 5, 17, 18, 710/29, 33, 50, 65, 129, 52, 66; 712/225, 223; 709/246, 238

(56) References Cited

U.S. PATENT DOCUMENTS

| | | | | |
|---|---|---|---|---|
| 4,477,896 A | * | 10/1984 | Aker | ............................ 370/24 |
| 4,587,445 A | * | 5/1986 | Kanuma | ....................... 326/28 |
| 4,609,834 A | | 9/1986 | Gal | .............................. 307/443 |

(List continued on next page.)

FOREIGN PATENT DOCUMENTS

| | | | | | |
|---|---|---|---|---|---|
| JP | 57113326 A | * | 7/1982 | .............. | G01J/1/42 |
| JP | 03012860 A | * | 1/1991 | ............ | G11B/20/02 |
| JP | 06202775 A | * | 7/1994 | .............. | G06F/3/00 |

OTHER PUBLICATIONS

"Switching Noise Reduction Using Combinatorial and Sequential Logic", IBM Technical Disclosure Bulletin, Oct. 1985, pp 2199–2200.*

(List continued on next page.)

Primary Examiner—Jeffrey Gaffin
Assistant Examiner—Rijue Mai
(74) Attorney, Agent, or Firm—Finnegan, Henderson, et al

(57) ABSTRACT

A method of communicating a data word via a bus includes driving the data word onto the bus in whichever one of a true polarity form and a complement polarity form that requires fewer bus lines to change state relative to a present state of each bus line, and providing an indicator signal to the bus to indicate which polarity form of the data word is driven onto the bus. The data word and the indicator signal may be received from the bus, and the polarity form of the data word is conditionally inverted in response to the indicator signal. A noise reduction system includes, for one embodiment, a sending circuit which compares each bit of a data word to be next communicated onto the bus against a corresponding bit of the present data word on the bus. If more than half the bits differ, then the next data word is inverted to form a complement next data word. The complement next data word is instead communicated onto the bus along with an indicator signal to indicate that a complement data word is communicated onto the bus. Consequently, no more than half the bits of the bus ever change state at a time, thus reducing the switching noise associated with communicating data words onto the bus. A bus interface includes a spatially distributed tally circuit having a respective portion thereof in close proximity with a respective output circuit for each respective bit of the data word. The tally circuit determines whether at least a certain number of bits within the next word differ from corresponding bits within the present bus state. The spatially distributed nature is particularly advantageous for accommodating an extremely wide bus, such as a 424-bit bus. In various embodiments, the tally circuit includes a summing node for accumulating an incremental signal for each bit of a group of bits within the next word which differs from a corresponding bit within the present bus state.

88 Claims, 9 Drawing Sheets

U.S. PATENT DOCUMENTS

| | | | |
|---|---|---|---|
| 4,613,771 A * | 9/1986 | Gal | 326/30 |
| 4,667,337 A * | 5/1987 | Fletcher | 377/41 |
| 4,724,340 A | 2/1988 | Sood | 307/443 |
| 4,725,747 A * | 2/1988 | Stein et al. | 327/389 |
| 4,992,676 A | 2/1991 | Gerosa et al. | 307/443 |
| 5,036,222 A | 7/1991 | Davis | 307/443 |
| 5,045,722 A | 9/1991 | Yang et al. | 307/443 |
| 5,053,643 A | 10/1991 | Tanaka et al. | 307/443 |
| 5,053,991 A * | 10/1991 | Burrows | 365/49 |
| 5,057,711 A | 10/1991 | Lee et al. | 307/443 |
| 5,142,167 A | 8/1992 | Temple et al. | 307/443 |
| 5,144,161 A | 9/1992 | Inaba | 307/443 |
| 5,148,056 A | 9/1992 | Glass et al. | 307/443 |
| 5,229,657 A | 7/1993 | Rackley | 307/443 |
| 5,311,076 A | 5/1994 | Park et al. | 307/443 |
| 5,359,239 A | 10/1994 | Sato | 307/451 |
| 5,420,525 A | 5/1995 | Maloberti et al. | 326/27 |
| 5,448,181 A | 9/1995 | Chiang | 326/27 |
| 5,471,150 A | 11/1995 | Jung et al. | 326/87 |
| 5,617,041 A * | 4/1997 | Lee et al. | 326/39 |
| 5,659,549 A * | 8/1997 | Oh et al. | 371/21.3 |
| 5,874,833 A * | 2/1999 | Perry et al. | 326/26 |
| 5,951,711 A * | 9/1999 | Mahant-Shetti et al. | 714/795 |
| 5,952,846 A * | 9/1999 | Silver | 326/41 |
| 5,974,259 A * | 10/1999 | Casal et al. | 713/300 |
| 6,072,329 A * | 6/2000 | Schenck | 326/26 |
| 6,243,779 B1 * | 6/2001 | Devanney et al. | 710/129 |
| 6,504,766 B1 * | 1/2003 | Pilo et al. | 365/189.01 |
| 6,553,445 B1 * | 4/2003 | Drapkin et al. | 710/305 |

OTHER PUBLICATIONS

Nakamura, K. et al., "A 50% Noise Reduction Interface Using Low–Weight Coding," 1996 Symposium VLSI Circuits Digest of Technical Papers, IEEE (Jun. 13, 1996), pp. 144–145.

Stan, M.R. et al., "Bus–Invert Coding for Low–Power I/O," IEEE Transactions on Very Large Scale Integration (VLSI) Systems, vol. 3, No. 1, Mar. 1995, pp. 49–58.

* cited by examiner

NOISE REDUCTION SYSTEM AND METHOD FOR REDUCING SWITCHING NOISE IN AN INTERFACE TO A LARGE WIDTH BUS

CROSS-REFERENCE TO RELATED APPLICATION

This application is a divisional of U.S. patent application entitled "Noise Reduction System And Method For Reducing Switching Noise In An Interface To A Large Width Bus", Ser. No. 08/755,542, by inventors William L. Devanney and Robert J. Proebsting, filed Nov. 21, 1996, now U.S. Pat. No. 6,243,779.

BACKGROUND OF THE INVENTION

1. Field of the Invention

The present invention relates to bus interfaces, and more particularly to reducing switching noise in a bus interface to a large bit-width bus.

2. Description of the Related Art

As communication buses carrying data and electronic signals are designed to accommodate an increasing number of bits, the problem of electronic switching noise substantially increases in severity. For example, an implementation of an Asynchronous Transfer Mode (ATM) packet routing system may be designed to accommodate an entire 53-byte standard packet as a single 424-bit (53×8) wide data word. Unfortunately, the combined electronic switching noise resulting from the in-phase switching of four hundred or more bits of a wide data bus must be addressed for this implementation, typically at a large cost in circuit resources.

A data bus for communicating a data word includes a respective bus line for carrying each respective bit within the data word. Each of the bus lines has two states, representing two possible binary values of each respective bit. Electronic switching noise is created when a bus line switches from a first state to a second state, which corresponds to a bit carried on the bus line changing from one logic state to the other logic state. A worst case switching noise condition occurs when all bits in a large-width multiple-bit data word switch at the same time in the same direction (for instance, from all "1"s to all "0"s). The amount of switching noise increases in approximately a linear manner from an essentially zero noise condition in which no bits switch to the worst case switching condition when all the bits switch.

Data transitions in which a large number of bits switch occur infrequently. However, the bus interface circuit must be designed to withstand the very large power supply spikes that result when worst-case sequences of data words are communicated on the bus. Typically, a large power supply voltage spike results when a large number of bits of a data bus are changed in the same direction simultaneously. Thus, when the electronic switching noise becomes sufficiently large, a device connected to the bus may switch logical state unintentionally so that incorrect data is communicated via the bus.

What is needed is a bus interface circuit that reduces worst case switching noise so that potential data transmission errors are reduced.

SUMMARY OF THE INVENTION

In accordance with the present invention, within a data word carried on a bus the maximum number of bits that simultaneously switch states is reduced by one-half, thereby approximately halving the worst case electronic switching noise spike that effects the system power supply or ground reference.

In accordance with the present invention, a method of communicating a data word via a bus includes driving the data word onto the bus in whichever one of a true polarity form and a complement polarity form that requires fewer bus lines to change state relative to a present state of each bus line. An indicator signal is provided to the bus to indicate which polarity form of the data word is driven onto the bus. The data word includes a plurality of bits and the bus includes a corresponding plurality of bus lines for carrying the plurality of bits. Each of the plurality of bus lines has a first and a second state representing binary values of a bit associated therewith. The method may also include receiving the data word from the bus, receiving the indicator signal from the bus, and conditionally inverting the polarity form of the data word in response to the indicator signal.

The first and second states may be first and second voltages or may be first and second currents. The first and second states of each respective bus line may represent respective first and second binary values of an associated bit when the indicator signal is provided in a first state, and respective second and first binary values of an associated bit when the indicator signal is provided in a second state. The data word and a present data word corresponding to the present state of each bus line may be driven onto the bus by a single bus interface or by different bus interfaces. The invention lends itself well to implementation within a bus interface of an integrated circuit, which circuit may be used with other circuits to form a system carrying out the invention over a system bus. The bus may be either bidirectional or unidirectional, and may include circuits which both send and receive data words onto or from the bus.

In one embodiment of the invention, a bus interface for communicating a data word via a bus includes means for driving the data word onto the bus in whichever one of a true polarity form and a complement polarity form that requires fewer bus lines to change state relative to a present state of each bus line, and means for providing an indicator signal to the bus to indicate which polarity form of the data word is driven onto the bus.

In another embodiment of the invention, a method of communicating a data word via a bus includes the steps of: (1) comparing a present data word on the bus (i.e., present bus state) with a next data word to be next communicated via the bus; (2) driving the next data word onto the bus when fewer than a certain number of bits within the next data word differ from corresponding bits within the present data word; (3) driving an inverted next data word onto the bus when at least the certain number of bits within the next data word differ from corresponding bits within the present data word; and (4) driving an indicator signal onto the bus to indicate whether an inverted next data word is driven onto the bus. The certain number of bits may be chosen to be one-half the number of bits forming the data word, approximately one-half the number of bits forming the data word, or another number of bits.

In yet another embodiment, a bus interface circuit for communicating a data word via a bus, the data word including a plurality of bits, the bus including a corresponding plurality of individual bus lines for carrying the plurality of bits, each of the plurality of bus lines having first and second states representing binary values of a bit associated therewith, the bus interface includes a sending circuit which includes: (1) a determining circuit, responsive to a present data word on the bus and a data word to be next communicated onto the bus, for determining whichever one of the next data word and a complement next data word, if driven onto the bus, requires fewer bus lines to change state relative to the present data word on the bus; and (2) a polarity circuit for driving the next data word or the complement next data word onto the bus as determined by the determining circuit.

The polarity circuit may include a circuit for conditionally inverting each bit of the next data word to form the complement next data word. Alternatively, the polarity circuit may include a multiplexer circuit for choosing between the data word and the complement next data word, or may include other circuits. The determining circuit may be (but need not be) spatially distributed, having a respective portion thereof in close proximity with a respective output circuit for each respective bit of the data word. Likewise, the polarity circuit may be spatially distributed, having a respective portion thereof in close proximity with a respective output circuit for each respective bit of the data word. The bus interface may also include a receiving circuit for receiving a data word from the bus, and for reforming a data word upon receiving a complement data word from the bus.

The determining circuit may include: (1) a comparison circuit for determining, for each bit of data word to be next communicated onto the bus, whether each bit of the next data word differs from a corresponding bit of the present data word on the bus; and (2) a tally circuit coupled to the comparison circuit for determining whether at least a certain number of bits within the next data word differ from corresponding bits within the present data word.

One embodiment of the tally circuit includes: (1) a digital adder circuit for determining a total number of bits within the next data word which differ from respective bits within the present data word; (2) a reference circuit for generating a reference digital number; and (3) a numerical comparator circuit for comparing the total number of bits which differ against the reference digital number, and for generating a POLARITY_CONTROL signal accordingly. The POLARITY_CONTROL signal may be an INVERT signal. Another embodiment of the tally circuit includes: (1) a summing node for accumulating an incremental signal for each bit within the next data word which differs from a corresponding bit within the present data word; and (2) a differential comparator having a first input terminal coupled to the summing node, having a second input terminal, and having an output terminal coupled to a POLARITY_CONTROL signal line. Yet another embodiment of the tally circuit includes: (1) a first summing node for accumulating an incremental signal for each bit of a first portion of bits within the next data word which differs from a corresponding bit within the present data word; (2) a second summing node for accumulating an incremental signal for each bit of a remaining portion of bits other than the first portion of bits within the next data word which matches a corresponding bit within the present data word; and (3) a differential comparator having a first input terminal coupled to the first summing node, having a second input terminal coupled to the second summing node, and having an output terminal coupled to a POLARITY_CONTROL signal line.

Many advantages are gained by the present invention. One advantage is that worst-case switching noise is reduced. Another advantage is that switching noise is reduced using a noise reduction circuit that is simple, small and fast so that transmission delay is not significantly impeded (and bandwidth, of course, need not be impacted at all). Another advantage is that fewer power (e.g., VDD) and reference (e.g., VSS or GND) pins need be employed to drive binary signals onto the bus. In particular, for the same amount of switching noise the number of power and reference pins is approximately halved by the described circuits and operating method. It is also highly advantageous that, since fewer pins are utilized in an integrated circuit, the cost of manufacturing the integrated circuit package is substantially reduced. Still another advantage is that power is conserved by reducing the number of bits switched at one time from possibly many bits to substantially fewer bits. In particular, the dynamic power for driving signals onto the bus is reduced.

The invention may be advantageously implemented using a spatially distributed analog circuit. Such an analog implementation may be much smaller than a digital implementation, particularly for data buses with many bits.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION OF THE PREFERRED EMBODIMENTS

Figure 1:
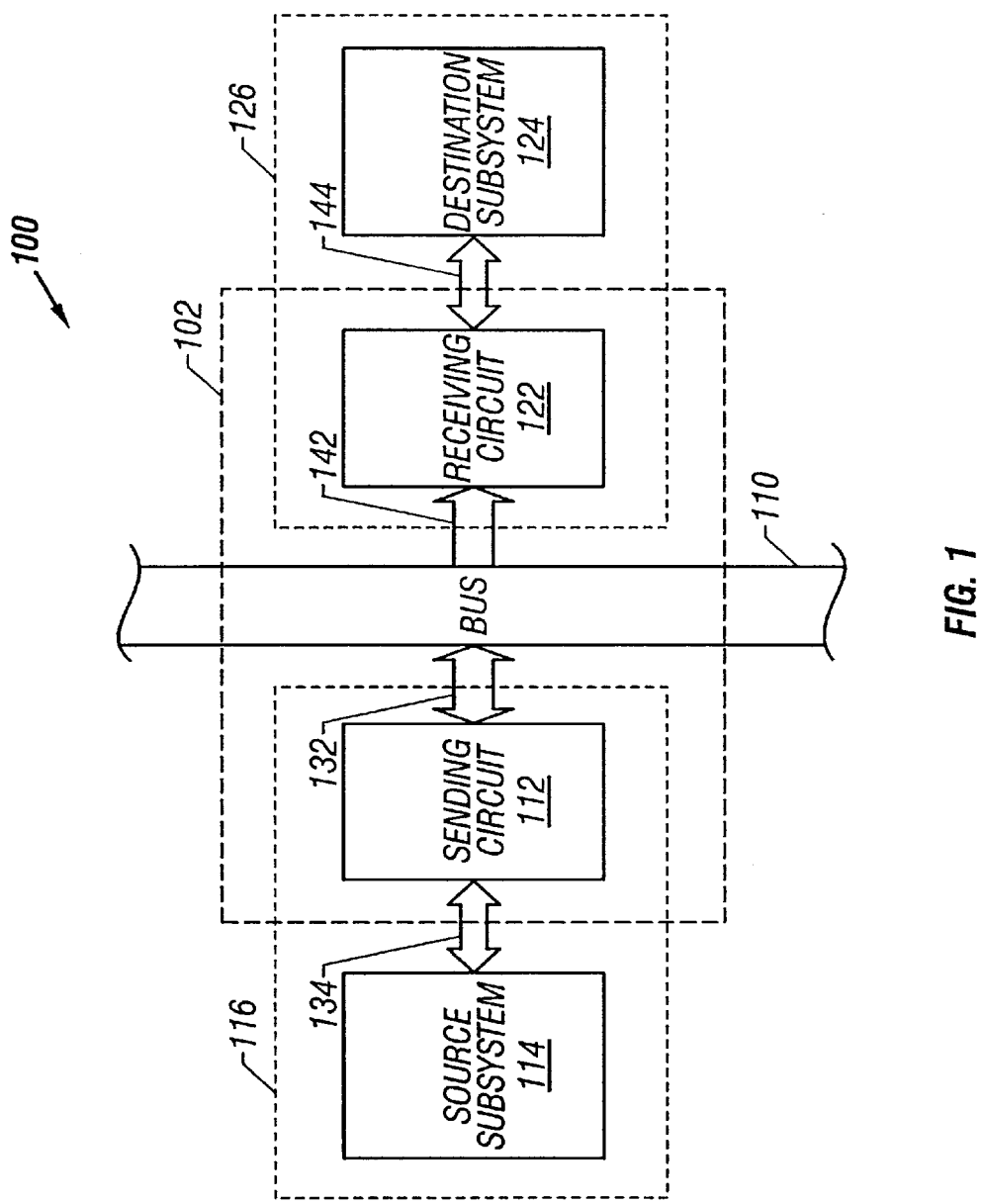
FIG. 1 is a schematic block diagram which illustrates a bus interface circuit in accordance with an embodiment of the present invention.

FIG. 1 illustrates a system 100 including a bus 110 for communicating digital signals from a source subsystem 114 to a destination subsystem 124. The source subsystem 114 communicates via a bus 124 to a sending circuit 112, which drives the digital information onto the bus 110. A bus 142 communicates the digital information from the bus 110 to a receiving circuit 122, which communicates via a bus 144 to the destination subsystem 124. The source subsystem 114 and the destination subsystem 124 exemplify portions of various system circuits such as processors, memories, special purpose drivers and the like including circuits that typically are interfaced to an information transmission bus. The source subsystem 114 and the sending circuit 112 may be incorporated into a single bus node 116, which may be implemented as a single integrated circuit or may be implemented as distinct integrated circuits within a complex multi-circuit subsystem in its own right. Likewise, the receiving circuit 122 and the destination subsystem 124 may be incorporated into a single bus node 126, which may be implemented as a single integrated circuit or may be implemented as distinct integrated circuits within a complex multi-circuit subsystem as well.

Operation of the system 100 is exemplified in a simple form by considering a small eight-bit wide data bus 110. For an eight-bit data bus, conventional and normal transmission of a first data word having a binary value of "00000000" followed by transmission of a second data word having a binary value of "1 1111111" results in all eight bits changing state from "0" to "1" When bits change state, switching activity causes a voltage spike on the power supply and/or ground. The magnitude of the voltage spike is predictably based on the number of bits that switch state and various circuit characteristics. In contrast, when preparing to transmit the second data word, the sending circuit 112 determines that more than half of the bus lines within the bus 110 would change state if a true polarity form of the second data word were transmitted. The sending circuit 112 instead drives a complement polarity form of the second data word onto the bus 110 along with an indicator signal to indicate that the second data word is transmitted in complement polarity form. In this example, the sending circuit 112 transmits a second word having a binary value of "00000000" along with an indicator signal having a value of "1" to indicate that the second data word is transmitted in complement polarity form. In other words, the sending circuit 112 sends the second data word as "00000000;1", where the "00000000" signal is a bit-wise inversion of the true polarity form of the second data word "11111111". The trailing "1" represents the indicator signal, which here is an inversion signal. By sending the second data word in a complement polarity form (i.e., as a complement second data word), only the single-bit inversion signal changes state when the second data word is driven onto the bus 110, rather than all eight bits changing state. In this example, the noise resulting from the data transition on the bus 110 is reduced by at least 7/8.

If a third data word also having a value of "11111111" is to be next communicated onto the bus by the sending circuit 112, then the third data word is driven onto the bus 110 as "00000000;1", and no bus lines at all change state compared to the second data word (in this example, a "coded" complement polarity representation of the original second data word received from the source subsystem 114), including the indicator signal.

A noise reduction system 102 includes both the sending circuit 112 and the receiving circuit 122. The sending circuit 112 includes circuits for determining whether to drive a next data word onto the bus 110 in a true polarity form or in a complement polarity form. A determination to transmit a complement next data word may be made when at least half of the bits within the next data word, if driven onto the bus 110, would cause a corresponding bus line to change states relative to a present data word, (i.e., present bus state) already drive onto the bus 110. Alternatively, such a determination may be made when approximately half the bits or more would change state, or when at least any particular number of bits would change state.

In one embodiment, whenever at least half the bits within the next data word differ from the present data word currently driven onto the bus 110, the sending circuit 112 inverts each bit within the next data word to form a complement next data word, drives the complement next data word onto the bus 110, and drives a single-bit INVERT signal onto the bus 110 to indicate that the data word driven onto the bus 110 is driven in complement polarity form. The single-bit INVERT signal is received by the receiving circuit 122 and used, for example, to reform the true polarity form of the next data word when a complement polarity form of the next data word is driven onto the bus 110.

Figure 2:
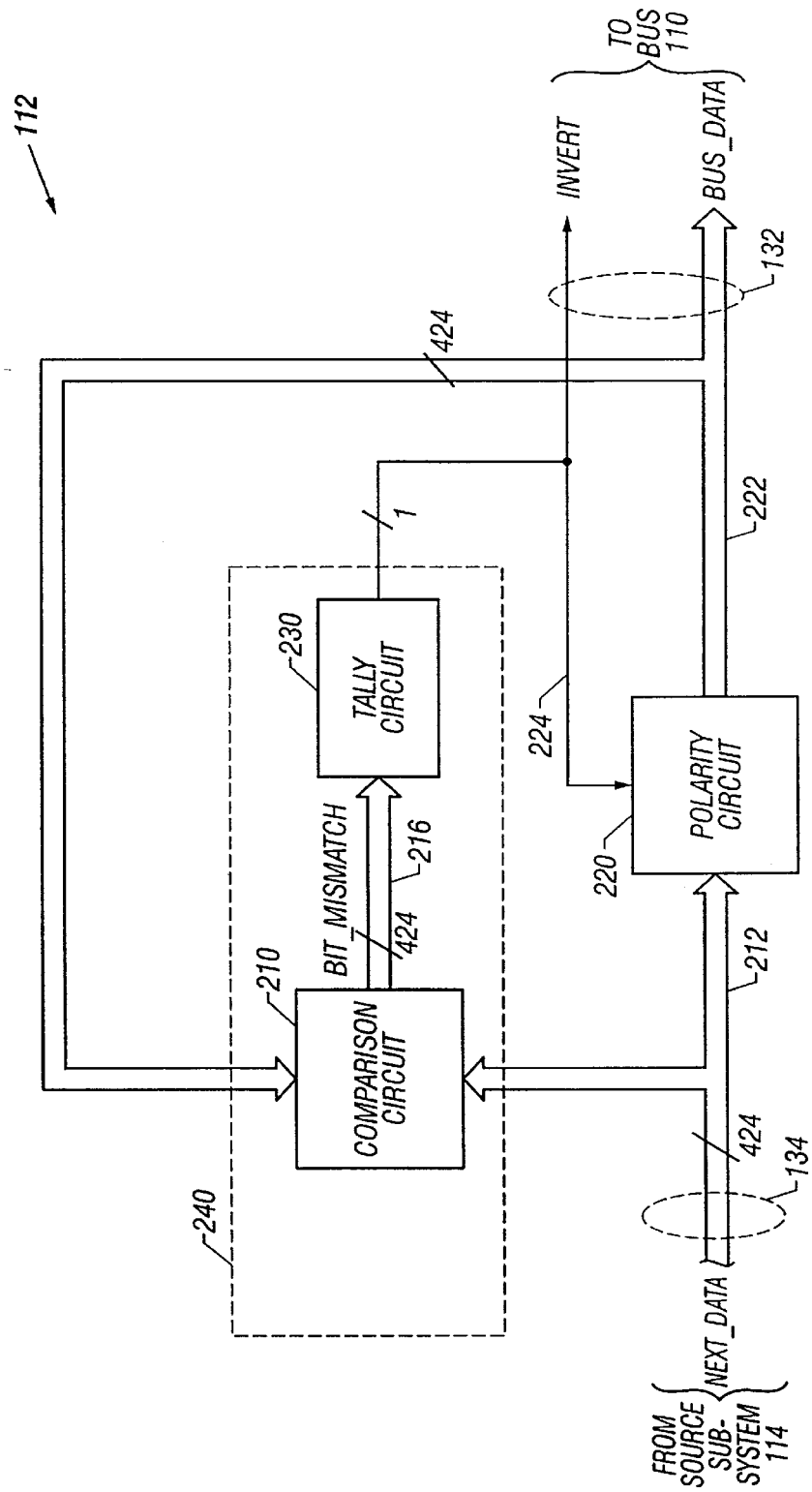
FIG. 2 is a schematic block diagram of an embodiment of the sending circuit depicted in FIG. 1.

FIG. 2 shows an embodiment of the sending circuit 112 for a 424-bit data word. The sending circuit 112 includes a comparison circuit 210, a polarity circuit 220 and a tally circuit 230. The comparison circuit 210 and the tally circuit 230 together form a determining circuit 240 which determines whether to transmit a data word in either a true polarity or complement polarity form, and which outputs an INVERT signal on INVERT signal line 224. This INVERT signal is provided to both the polarity circuit 220 and to the bus 110.

A data word is communicated from the source subsystem 114 via a 424-bit wide NEXT_DATA bus 212 (being a portion of the bus 234) to both the comparison circuit 210 and to the polarity circuit 220. The present data word on the bus 110 is provided to the comparison circuit 210 via a 424-bit wide BUS_DATA bus 222 which forms a portion of the bus 132. The present data word on the bus 110 is the data word most recently communicated onto the bus 110, and may either have been driven onto the bus 110 by the sending circuit 112 or by a different sending circuit (residing in a separate bus interface).

The comparison circuit 210 is connected to the tally circuit 230 by a 424-bit BIT_MISMATCH bus 216, which conveys a respective BIT_MISMATCH.X signal for each respective bit "X" within the data word. A respective BIT_MISMATCH.X signal indicates whether the respective bit "X" within the data word received from the source subsystem 114 (i.e., the "next" data word) differs from (i.e., "mismatches") or matches a corresponding bit within the data word presently on the bus 110 (i.e., the "present" data word).

The tally circuit 230 determines whether at least a certain number of bits within the next data word differ from corresponding bits within the present data word, and if so, tally circuit 230 generates an INVERT signal conveyed on INVERT signal line 224 to the polarity circuit 220 and also to the bus 110. If the INVERT signal is asserted by the tally circuit 230, the next data word is inverted by the polarity circuit 220 to form a complement next data word, which is then driven onto the bus 110. The INVERT signal is also received by the receiving circuit 122 to indicate that a respective data word driven onto the bus 110 is a complement data word.

The polarity circuit 220 either inverts each bit of the next data word or allows each bit to pass without inversion, depending on the state of the INVERT signal. The polarity circuit 220 is connected to the bus 110 by the 424-bit wide BUS_DATA bus 222 to drive each bit of the data word onto a respective bus line of the bus 110. The BUS_DATA bus 222 is also connected to the comparison circuit 210 for providing the present data word on the bus 110 (which frequently may be the previous data word transmitted onto the bus 110 by the sending circuit 112) to the comparison circuit 210.

Figure 3:
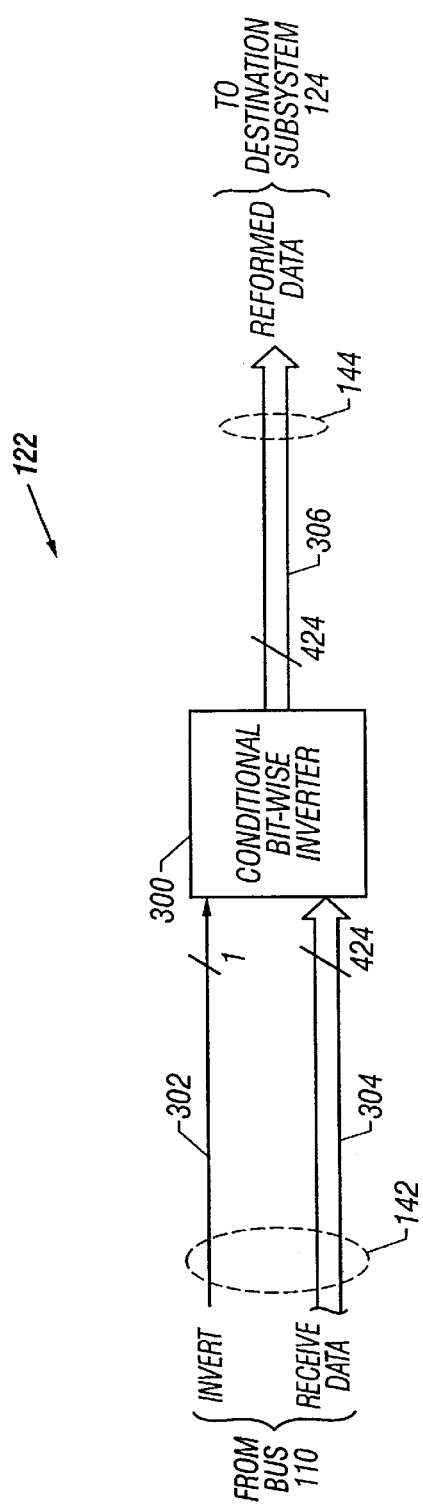
FIG. 3 is a schematic block diagram of an embodiment of the receiving circuit depicted in FIG. 1.

FIG. 3 shows an embodiment of the receiving circuit 122. A conditional bit-wise inverter circuit 300 receives a data word from the bus 110 via a 424-bit RECEIVE_DATA bus 304 (being a portion of the bus 142) and also receives the INVERT signal conveyed on an INVERT signal line 302 (also being a portion of the bus 142) from the bus 110. The conditional bit-wise inverter circuit 300 receives a data word previously driven onto the bus 110 by the polarity circuit 220, monitors the INVERT signal conveyed on the INVERT signal line 302, and reconstructs the original data word from a complement data word when the INVERT signal is asserted, and conveys the reformed data word on a 424-bit REFORMED_DATA bus 306 to the destination subsystem 124.

Figure 4:
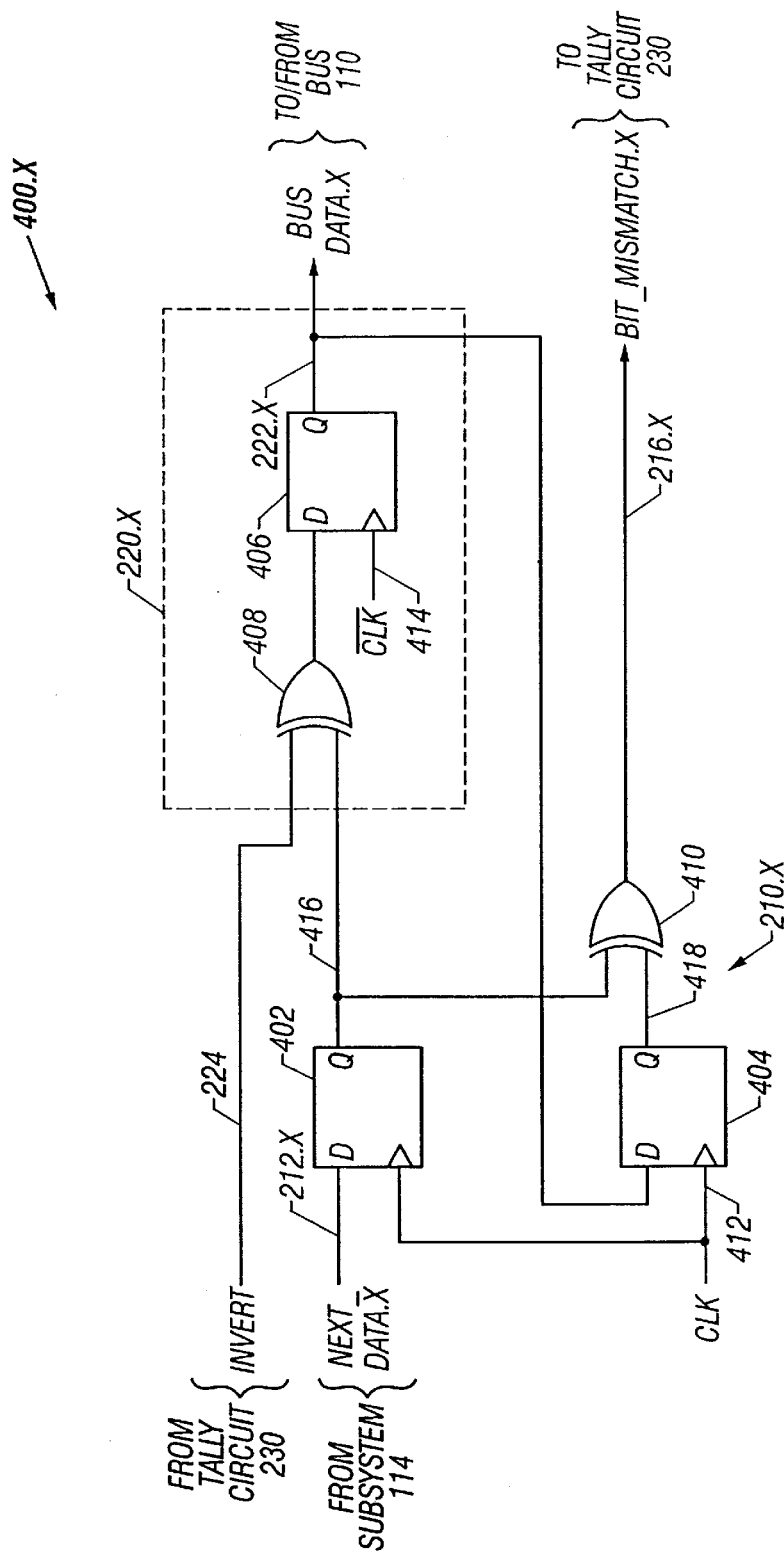
FIG. 4 is a schematic circuit diagram of an embodiment of a portion of the comparison circuit and polarity circuit depicted in FIG. 2 for one-bit of a data word.

Referring to FIG. 4, an embodiment of the comparison circuit 210 and the polarity circuit 220 are shown for a respective bit "X" within the data word and which together form a COMPARE/INVERT circuit 400.X. A bit-wise comparison circuit 210.X forms a one-bit portion of the comparison circuit 210 for a respective bit "X". The 424-bit comparison circuit 210 includes 424 bit-wise comparison circuits 210.X, which are individually referred to as bit-wise comparison circuit 210.1, bit-wise comparison circuit 210.2, bit-wise comparison circuit 210.3, and so forth through bit-wise comparison circuit 210.424.

The bit-wise comparison circuit 210.X includes a next data register flip-flop 402 that forms one bit of a next data register for storing the 424-bit next data word, a present data register flip-flop 404 that forms one bit of a present data register for storing the 424-bit present data word, and a comparison XOR gate 410. The next data register flip-flop 402 is, for this embodiment, a D flip-flop that has a D-input terminal connected to receive a respective bit of the next data word conveyed on a NEXT_DATA bus line 212.X, a clock terminal connected to receive a system clock CLK conveyed on a clock line 412, and a Q-output terminal connected via a node 416 to a first input terminal of a comparison XOR gate 410. The present data register flip-flop 404 is, for this embodiment, a D flip-flop that has a D-input terminal connected to receive a respective bit of the present data word conveyed on a BUS_DATA bus line 222.X, a clock terminal connected to receive the system clock CLK conveyed on clock line 412, and a Q-output terminal connected via a node 418 to a second input terminal of the comparison XOR gate 410. The output terminal of the comparison XOR gate 410 is connected to a BIT_MISMATCH bus line 216.X for conveying a respective BIT_MISMATCH.X signal for the respective bit "X". The BIT_MISMATCH.X signal is asserted (e.g., driven to a logic "1" for this embodiment) when the respective bit within the next data word differs from a corresponding bit within the present data word. The next data register flip-flop 402 and the present data register flip-flop 404 function as storage circuits which sample the data state of each respective bit on the rising edge of the clock signal CLK conveyed on clock line 412. The respective outputs of each flip-flop are compared by the comparison XOR gate 410 which asserts the BIT_MISMATCH.X signal when the inputs to the comparison XOR gate 410 differ in logic value. If, however, the two inputs of comparison XOR gate 410 match (have the same logic value), then the BIT_MISMATCH.X signal is deasserted. Each of the BIT_MISMATCH.X signals are collectively communicated to the tally circuit 230 via BIT_MISMATCH bus 216 as depicted in FIG. 2.

The bit-wise polarity circuit 220.X forms a one-bit portion of the polarity circuit 220, and includes an inversion XOR gate 408 for receiving and conditionally inverting a respective bit of the next data word, and an output data register flip-flop 406 that forms one bit of an output data register for storing a 424-bit output data word for driving onto the bus 110. The Q-terminal of the next data register flip-flop 402 (within the bit-wise comparison circuit 210.X) is also connected via node 416 to a first input terminal of the inversion XOR gate 408. (In this specific embodiment, the respective bit of the next data word is received indirectly from the NEXT_DATA bus line 212.X by way of the next data register flip-flop 402 within the bit-wise comparison circuit 210.X. Alternatively, the respective bit may be received directly from the NEXT_DATA bus line 212.X, as depicted in FIG. 2.) The second input terminal of the inversion XOR gate 408 is connected to an INVERT signal line 224 which conveys an INVERT signal from the tally circuit 230. The output data register flip-flop 406 is, for this embodiment, a D flip-flop that has a D-input terminal connected to the output terminal of the inversion XOR gate 408, a clock terminal connected to receive a complement system clock/CLK conveyed on a clock line 414, and a Q-output terminal connected to a BUS_DATA bus line 222.X for conveying the respective bit of the output data word to the bus 110. For the example shown, a total of 424 individual BUS_DATA bus lines 222.X collectively form the BUS_DATA bus 222 depicted in FIG. 2.

On the rising edge of the clock signal CLK, a respective bit within the next data word conveyed on NEXT_DATA bus line 212.X is clocked into the next data register flip-flop 402 and the corresponding bit of the present data word on the bus 110 is clocked (via BUS_DATA bus 222.X) into the present data register flip-flop 404. The comparison XOR gate 410 compares the outputs of the next data register flip-flop 402 and the present data register flip-flop 404 and generates an active high BIT_MISMATCH.X signal if they differ and inactive-low BIT_MISMATCH.X signal if they match.

Each of the BIT_MISMATCH.X signals is conveyed to the tally circuit 230 which determines (as discussed in detail below) whether to output the next data word in either a true polarity form or a complement polarity form. If the tally circuit 230 determines that a complement next data word should be outputted onto the bus 110, the tally circuit 230 asserts an active high INVERT signal conveyed on INVERT signal line 224. Alternatively, if the tally circuit 230 determines that the next data word in true polarity form should be outputted onto the bus 110, the tally circuit 230 deasserts the INVERT signal (e.g., by driving it to a logic low level). The determination by the tally circuit 230, the corresponding generation of the INVERT signal appropriately asserted or deasserted, and any conditional inversion of the respective bit by the inversion XOR gate 408 (or mere propagation of the uninverted bit) are all accomplished before the rising edge of the complement system clock/CLK (the falling edge of system clock CLK), which clocks the respective bit of the output data word into the output data register flip-flop 406 for presentation to the bus 110 via a respective BUS_DATA bus line 222.X.

It should be emphasized that the comparison XOR gate 410 functions to generate a signal indicating whether a respective bit within the next data word matches or differs from a corresponding bit within the present data word on the bus 110. A variety of other logic structures may be used to accomplish this function, including an XNOR gate (which would generate a BIT_MISMATCH-like signal but having reversed polarity). Similarly, while the embodiment shown uses a next data storage circuit and a present data storage circuit that are shown as D flip-flops, a variety of other storage circuits, such as latches or other types of flip-flops, may be employed. Moreover, storage circuits need not be employed at all within the bit-wise comparison circuit 210.X if bus timings present sufficient data valid times for both the next data word and the present data word. It should also be emphasized that the inversion XOR gate 408 functions to conditionally invert a respective bit within the next data word to form a complement next data word. A variety of other logic structures may be used to accomplish this function, including an XNOR gate. The polarity of the output data word may be preserved when using an XNOR gate by use of a complementary output from a storage flip-flop, or by any other convenient inversion. Similarly, while the embodiment shown uses an output data storage circuit that is shown as a D flip-flop, a variety of other storage circuits, such as latches or other types of flip-flops, may be alternatively employed. Moreover, an output storage circuit need not be employed at all depending on necessary bus timings.

Figure 5:
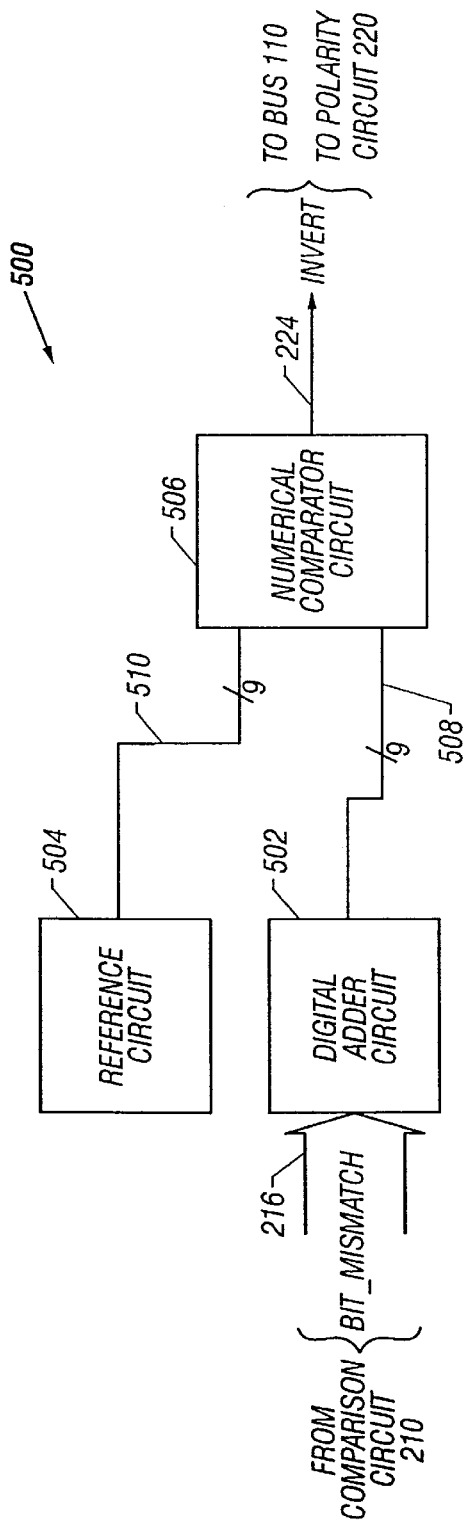
FIG. 5 is a schematic block diagram of a digital embodiment of the tally circuit depicted in FIG. 2.

FIG. 5 shows a digital embodiment 500 of the tally circuit 230. Each of the BIT_MISMATCH.X signals from respective bit-wise comparison circuits 210.X is received by a digital adder circuit 502 via the BIT_MISMATCH bus 216. The digital adder circuit 502 counts the number of BIT_MISMATCH.X signals which are asserted (which number corresponds to the number of bits within the next data word which differ from corresponding bits within the present output data word). In other words, the digital adder circuit 502 adds the "0" and "1" logic values of each of the BIT_MISMATCH.X signals to generate a sum that is equal to the number of logic "1" bits encountered. A digital word representing such a total number is provided to a numerical comparator circuit 506 via a 9-bit digital bus 508 (which, of course, allows a number from 0 to 511 to be represented). A reference circuit 504 generates a reference number which is also provided to the numerical comparator circuit 506 via a 9-bit digital bus 510. The numerical comparator circuit 506 compares the magnitudes of these two numbers and generates an active-high INVERT signal (for this embodiment) conveyed on the INVERT signal line 224 when the total number of differing bits exceeds the reference number generated by the reference circuit 504. As described above, the INVERT signal is then conveyed to each of the respective bit-wise polarity circuits 220.X to conditionally invert the next data word to form the complement next data word. The INVERT signal is also conveyed to the bus 110.

The reference number generated by the reference circuit 504 is preferably chosen to invert the next data word whenever half or more of the bits within the next data word differ from corresponding bits within the present data word. In other words, if driving the next data word onto the bus 110 would result in at least one-half of the bus lines (e.g., the "trigger" value) within the bus 110 changing state compared to the present state of each bus line, then the tally circuit 230 generates an INVERT signal which causes the complement next data word to instead be driven onto the bus 110. Nevertheless, the advantages of the invention may be achieved when other trigger values than one-half the total bits are chosen. For example, in a 424-bit wide data bus, the tally circuit 230 may be configured to generate an INVERT signal when one-half the bits differ (as described above), when approximately one-half the bits differ, or when any number of bits differ. In each case, the noise resulting from a worst-case transition never reaches that which would result from all the bits changing state.

Figure 6:
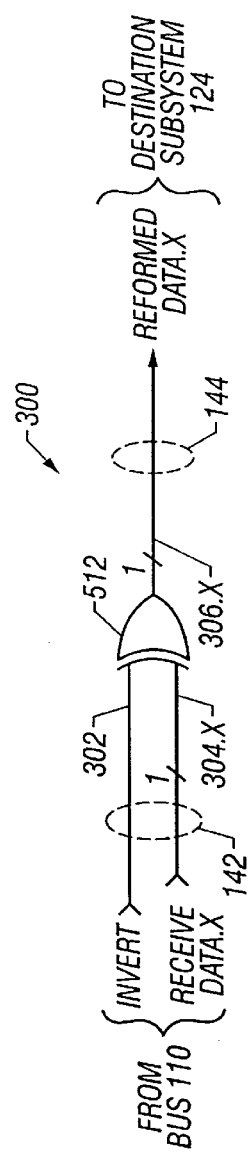
FIG. 6 is a schematic circuit diagram of an embodiment of the receiving circuit depicted in FIG. 2 for one-bit of a data word.

Referring to FIG. 6, an embodiment of the conditional bit-wise inverter circuit 300 for a respective bit "X" of a data word is shown. A receive XOR gate 512 receives the INVERT signal from the bus 110 via an INVERT signal line 302 (being a signal within the bus 142 depicted in FIG. 1). The INVERT signal line 302 is connected to a first input of the receive XOR gate 512, while a second input of the receive XOR gate 512 is connected to receive a respective bit conveyed on a RECEIVE_DATA bus line 304.X from the bus 110. If the INVERT signal received from the bus 110 is set to a logic high (a logic "1") then the receive XOR gate 512 inverts the respective bit of the data word received from the bus 110 to reform the data word in true polarity form. The output of receive XOR gate 512 conveys a respective bit of the reformed data word on a REFORMED_DATA bus line 306.X. Alternatively, if the INVERT signal received from the bus 110 is set to a logic "0" then the receive XOR gate 512 propagates the respective bit of the data word received from the bus 110 unchanged. In either case, the output of the receive XOR gate 512 is conveyed to the destination subsystem 124 via the REFORMED_DATA bus line 306.X (being a portion of the bus 144 depicted in FIG. 1). The circuit resources of the conditional bitwise inverter circuit 300 are minimal and operation is simple and highly efficient, advantageously facilitating a low-cost implementation.

Figure 7:
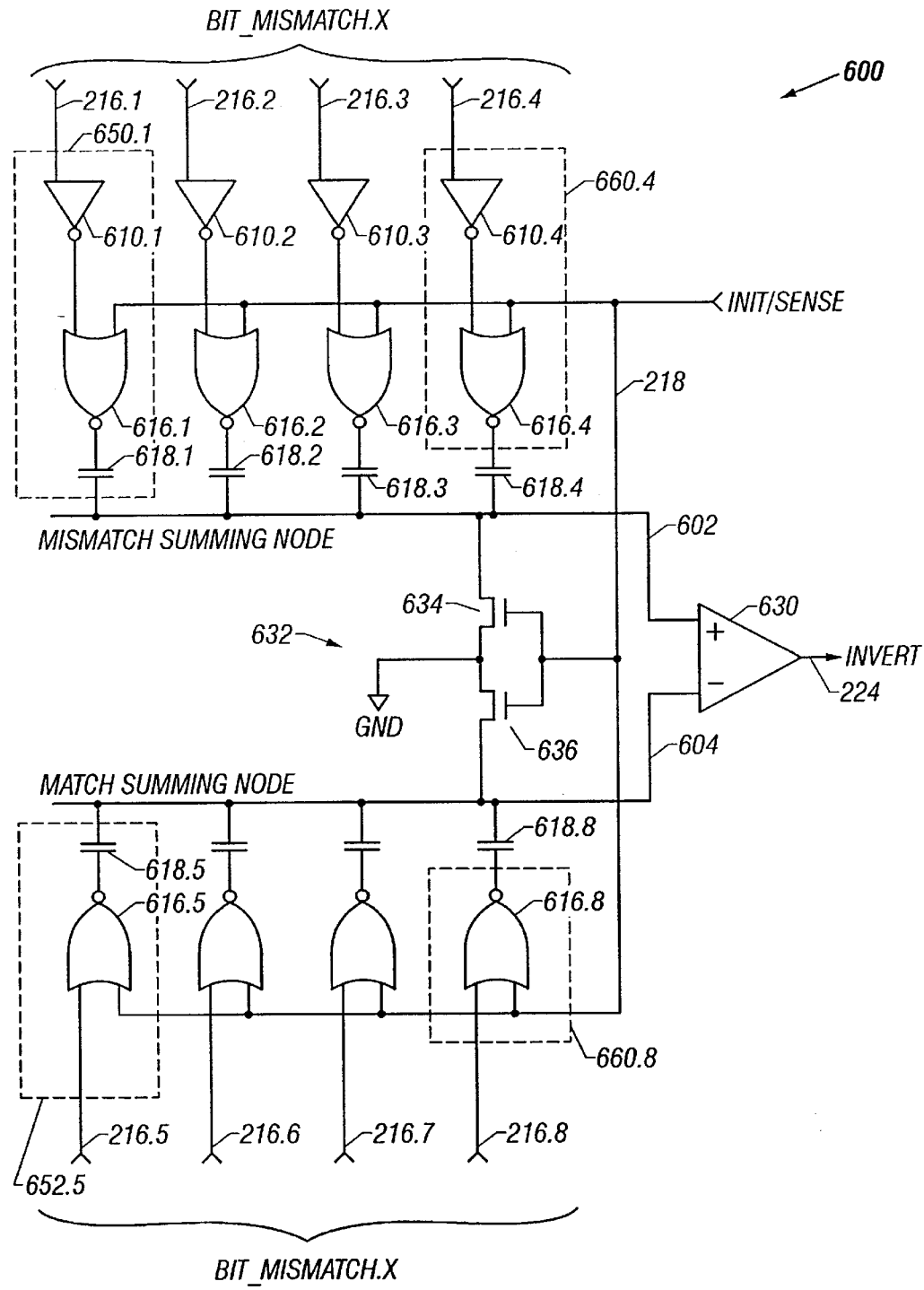
FIG. 7 is a schematic circuit diagram of an analog embodiment of the tally circuit depicted in FIG. 2.

In contrast to that shown in FIG. 5, a different embodiment of the tally circuit 230, being a split-node capacitive summing circuit 600, is depicted in a schematic circuit diagram shown in FIG. 7. The split-node capacitive summing circuit 600 includes two summing nodes, being a mismatch summing node 602 and a match summing node 604, and further includes a differential comparator 630. The mismatch summing node 602 accumulates an incremental signal for each bit of a first portion of bits within the next data word which differs from (or mismatches) a corresponding bit within the present data word, as will be discussed more fully below. The match summing node 604 accumulates an incremental signal for each bit of a remaining portion of bits within the next data word which matches a corresponding bit within the present data word, as will be discussed more fully below. The differential comparator 630 has a non-inverting input terminal connected to the mismatch summing node 602, an inverting input terminal connected to the match summing node 604, and an output terminal connected to the INVERT signal line 224.

Transistors 634 and 636 together form an equilibration circuit 632 for equilibrating the voltages of the mismatch summing node 602 and the match summing node 604 to a common reference voltage, which for this embodiment is circuit ground (GND or VSS). An INIT/SENSE signal is conveyed on an INIT/SENSE signal line 218 to the gates of N-channel IGFET transistors 634 and 636. The respective source of each transistor is connected to a voltage reference terminal which is in turn connected to receive the ground (GND) reference voltage.

As previously stated, the mismatch summing node 602 accumulates an incremental signal for each bit of a first portion of bits within the next data word which mismatches a corresponding bit within the present data word. In the exemplary embodiment shown in FIG. 7, the first portion of bits is one-half of the bits, and the incremental signal is an incremental voltage signal. Alternatively, the incremental signal may be an incremental current signal. Moreover, the portion of bits may configured to be other than one-half of the bits.

For ease of discussion, the split-node capacitive summing circuit 600 shown in FIG. 7 is shown configured for an 8-bit data word. (Extension to a 424-bit configuration is straightforward, as is discussed below.) An urging circuit is provided for each bit of the data word to sense the respective BIT_MISMATCH.X signal for each respective bit "X", and to urge the voltage of a summing node accordingly. For one half of the bits (being in this example bits 1–4), the BIT_MISMATCH.X signal is sensed and each mismatch results in an additional positive voltage signal accumulated on the mismatch summing node 602. In particular, an urging circuit

650.1 has a first input terminal connected to receive the BIT_MISMATCH.1 signal conveyed on the BIT_MISMATCH bus line 216.1 from the corresponding bit-wise comparison circuit 210.1, has a second input terminal connected to receive a SENSE signal conveyed on an INIT/SENSE line 218, and has an output terminal connected to the mismatch summing node 602. An identical circuit structure is provided for each of the three other bits. Each of the BIT_MISMATCH bus lines 216.2, 216.3, and 216.4 is coupled to a respective urging circuit 650.2, 650.3, and 650.4 (not shown, but each identical to urging circuit 650.1) which are all connected to the mismatch summing node 602.

For the other half of the bits (being in this example bits 5–8), the BIT_MISMATCH.X signal for each respective bit is sensed and each match (rather than mismatch) results in an additional positive voltage signal accumulated on the match summing node 604. In particular, an urging circuit 652.5 has a first input terminal connected to receive the BIT_MISMATCH.5 signal conveyed on the BIT_MISMATCH bus line 216.5 from the corresponding bit-wise comparison circuit 210.5, has a second input terminal connected to receive the SENSE signal conveyed on the INIT/SENSE line 218, and has an output terminal connected to the match summing node 604. An identical circuit structure is provided for each of the three remaining other bits. Each of the BIT_MISMATCH bus lines 216.6, 216.7, and 216.8 is coupled to a respective urging circuit 652.6, 652.7, and 652.8 (not shown, but each identical to urging circuit 652.5) which are all connected to the match summing node 604.

Each of the urging circuits 650.X coupled to the mismatch summing node 602 includes (for this embodiment) an inverter 610.X, a NOR gate 616.X, and a capacitor 618.X. The input terminal of a respective inverter 610.X is connected to the respective BIT_MISMATCH bus line 216.X. A respective NOR gate 616.X has a first input terminal connected to the output terminal of the respective inverter 610.X, a second input terminal connected to the INIT/SENSE line 218, and an output terminal connected to the first terminal of the respective capacitor 618.X. The second terminal of the respective capacitor 618.X is connected to the mismatch summing node 602.

Each of the urging circuits 652.X coupled to the match summing node 604 is similar but lacks the inverter. Each includes (for this embodiment) a NOR gate 616.X and a capacitor 618.X. A respective NOR gate 616.X has a first input terminal connected to the respective BIT_MISMATCH bus line 216.X, a second input terminal connected to the INIT/SENSE line 218, and an output terminal connected to the first terminal of the respective capacitor 618.X. The second terminal of the respective capacitor 618.X is connected to the match summing node 604.

The operation of the split-node capacitive summing circuit 600 is best understood by initially assuming that the INIT/SENSE signal conveyed on the INIT/SENSE line 218 is high (a logical "1"). The transistors 634 and 636 are thus conductive and equilibrate the voltage of the both summing nodes 602 and 604, respectively, to ground potential (which is a logic "0" for this embodiment). Because the INIT/SENSE signal is a logic "1" and is received by one input terminal of each respective NOR gate 616.X, the output terminal of each respective NOR gate 616.X is driven low (to a logic "0"). Consequently, both terminals of each respective capacitor 618.X are held to a logic "0", and no voltage is developed across any of the respective capacitors 618.X. The logic state of any of the respective BIT_MISMATCH.X signals does not affect the initialization of the split-node capacitive summing circuit 600 described above.

When the INIT/SENSE signal is brought to a logic "0", however, the output terminal of each respective NOR gate 616.X is no longer forced to a logic "0" but now is free to track the logic state of the respective BIT_MISMATCH bus line 216.X. For example, if the BIT_MISMATCH.1 signal conveyed on the BIT_MISMATCH bus line 216.1 is a logic "1" (meaning, for this embodiment, that the first bit within the next data word differs from the corresponding bit within the present data word), the output of respective inverter 610.1 is low (a logic "0"), and the output of respective NOR gate 616.1 is driven high (to a logic "1"). Moreover, the two summing nodes 602 and 604 are "floated" since the transistors 634 and 636 are no longer conductive (and because the input impedance of the differential comparator 630 typically has no resistive component). Consequently, the low-to-high transition on the output terminal of the NOR gate 616.1 results in a capacitive coupling by capacitor 618.1 of an incremental positive voltage onto the mismatch summing node 602. If, on the other hand, the BIT_MISMATCH.1 signal conveyed on the BIT_MISMATCH bus line 216.1 is a logic "0" (meaning, for this embodiment, that the first bit within the next data word matches the corresponding bit within the present data word), the output of respective inverter 610.1 is high (a logic "1"), and the output of respective NOR gate 616.1 remains low. Consequently, since no transition occurs on the output terminal of the NOR gate 616.1, there is no capacitive coupling of any incremental voltage onto the mismatch summing node 602.

In the 8-bit exemplary embodiment of the split-node capacitive summing circuit 600, a group of four bits (bits 1–4, being a portion of the total bits) is associated with the mismatch summing node 602. Each bit within the next data word within this group which differs from a corresponding bit within the present data word results in an incremental positive capacitive coupling onto the mismatch summing node 602. If all bits differ, the voltage coupled onto the mismatch summing node 602 equals the magnitude of the low-to-high voltage transition on the output terminal of each respective NOR gate 616.X (assuming, of course, that the stray capacitance on the mismatch summing node 602 and the input capacitance of the differential comparator 630 are both negligible). If the logic swings of the NOR gates 616.X are "rail-to-rail" voltage swings (i.e., from one power supply voltage to the other), then the maximum voltage coupling onto the mismatch summing node 602 equals the power supply (VDD) potential. The respective inverter 610.X and NOR gate 616.X together form a respective kick circuit 660.X which senses the state of a respective BIT_MISMATCH.X in response to a SENSE signal, and conditionally develops an output transition for "kicking" the voltage of mismatch summing node 602 through a respective coupling capacitor 618.X. For example, inverter 610.4 and NOR gate 616.4 together form kick circuit 660.4, which conditionally couples a voltage through capacitor 618.4 onto mismatch summing node 602.

Consider now the generation of signal on the match summing node 604. When the INIT/SENSE signal is brought to a logic "0", the output terminal of each respective NOR gate 616.X is no longer forced to a logic "0" but now is free to track the logic state of the respective BIT_MISMATCH bus line 216.X. For example, if the BIT_MISMATCH.5 signal conveyed on the BIT_MISMATCH bus line 216.5 is a logic "0" (meaning, for this embodiment, that the fifth bit within the next data word matches the corresponding bit within the present data word), the output of respective NOR gate 616.5 is driven high (to a logic "1").

Consequently, the low-to-high voltage transition on the output terminal of the NOR gate 616.5 results in a capacitive coupling by capacitor 618.5 of an incremental positive voltage onto the match summing node 604. If, on the other hand, the BIT_MISMATCH.5 signal conveyed on the BIT_MISMATCH bus line 216.5 is a logic "1" (meaning, for this embodiment, that the fifth bit within the next data word differs from the corresponding bit within the present data word), the output of respective NOR gate 616.5 remains low. Consequently, since no transition occurs on the output terminal of the NOR gate 616.5, there is no capacitive coupling of any incremental voltage onto the match summing node 604.

In the 8-bit exemplary embodiment of the split-node capacitive summing circuit 600, a remaining group of four bits (being bits 5–8) is associated with the match summing node 604. Each bit of the next data word within this remaining group which matches a corresponding bit within the present data word results in an incremental positive capacitive coupling onto the match summing node 604. If all bits match, the voltage coupled onto the match summing node 604 equals the magnitude of the low-to-high voltage transition on the output terminal of each respective NOR gate 616.X (assuming, as before, that the stray capacitance on the match summing node 604 and the input capacitance of the differential comparator 630 are both negligible). If the logic swings of the NOR gates 616.X are "rail-to-rail" voltage swings, then the maximum voltage coupling onto the match summing node 604 equals the power supply (VDD) potential. The respective NOR gate 616.X forms a respective kick circuit 660.X which senses the state of a respective BIT_MISMATCH.X in response to a SENSE signal, and conditionally develops an output transition for "kicking" the voltage of match summing node 604 through a respective coupling capacitor 618.X. For example, NOR gate 616.8 forms a kick circuit 660.8, which conditionally couples a voltage through capacitor 618.8 onto match summing node 604.

The final voltage on the mismatch summing node 602 after sensing depends upon the number of bits, among those bits associated with the mismatch summing node 602, that mismatch. Similarly, the final voltage on the match summing node 604 after sensing depends upon the number of bits, among those bits associated with the match summing node 604, that match. The final voltage of either summing node 602 or 604 varies from VSS (GND) to VDD, as described above. The differential comparator 630 drives the INVERT signal conveyed on the INVERT signal line 224 to a logic "1" when the voltage of the mismatch summing node 602 exceeds that of the match summing node 604. The INVERT signal becomes valid as soon as resulting summing node voltages are sensed by the differential comparator 630.

The connection of the initialization signal INIT/SENSE conveyed on INIT/SENSE signal line 218 to the split node capacitive summing circuit 600 is supplied for initialization or equilibration to establish a suitable initial voltage on the summing nodes 602 and 604. Initialization is performed periodically, perhaps every cycle, by pulsing the INIT/SENSE signal to a logic "1". Once initialized, it is not necessary that the INIT/SENSE signal be pulsed every cycle, as the voltage on both the mismatch summing node 602 and the match summing node 604 is established according to then-current values of the BIT_MISMATCH.X signals provided on the respective BIT_MISMATCH bus lines 216.X.

Operation of the split-node capacitive summing circuit 600 is exemplified by considering a bus 110 having an even number of bits, 2N. One-half (N) of the bits are associated with the mismatch summing node 602 and the remaining half (N) of the bits are associated with the match summing node 604. Assume that the number of bits of the N bits driving the mismatch summing node 602 that "vote" to switch polarity is A (i.e., the number of bits (of this N bit portion) within the next data word that differ from corresponding bits within the present data word) and the number of bits of the N bits driving the match summing node 604 that "vote" to switch polarity is B. Accordingly, the number A+B is the total number of the 2N bits that vote to switch polarity. If A+B is greater than N, then more than half of all the bits vote to switch.

Both the summing nodes 602 and 604 are initialized to ground, as described above. When the initialization signal is removed, the voltage on the mismatch summing node 602 increases by an amount equal to $(A/N)_{VDD}$, assuming negligible stray capacitance on the mismatch summing node 602. Removal of the initialization signal also causes the voltage on the match summing node 604 to increase since, in this case, the bits that vote not to switch cause the match summing node 604 to increase in voltage. The resulting differential signal into the differential amplifier 630 is $V_{602}-V_{604}$, which has a value, as follows:

$$V_{602} - V_{604} = (A/N)V_{DD} - ((N-B)/N)V_{DD}$$
$$= (A/N - (N-B)/N)V_{DD}$$
$$= (V_{DD}/N)(A - N + B)$$
$$= (V_{DD}/N)(A + B - N)$$

Therefore if A+B is greater than N, then $V_{602}-V_{604}$ is greater than zero and the INVERT signal is driven to a logic "1" value, which as colloquially described indicates that more than half the total bits "vote" to switch polarity. In other words, more than half the total bits "vote" to invert the next data word before driving it onto the bus 110. If A+B is less than N, then $V_{602}-V_{604}$ is less than zero and the INVERT signal is driven to (or remains at) a logic "0" value, which indicates that less than half the total bits "vote" to switch polarity. If the number of bits in the upper half that vote to switch exceeds the number of bits in the lower half that vote not to switch, then the INVERT signal is generated with a logic "1" and the next data word is driven onto the bus 110 as a complement next data word.

It should be appreciated that the required common-mode operating range of differential comparator 630 is VSS to VDD (again, assuming negligible stray capacitance).

In an alternative embodiment of the tally circuit 230 similar to the split-node capacitive summing circuit 600, a single summing node (not shown) is used to accumulate an incremental signal for each respective output bit, and the single summing node is compared to a reference voltage such as VDD divided by two (VDD/2) to generate the INVERT signal. All respective capacitors (analogous to capacitors 618.X) are connected to the single summing node and each respective urging circuit increases the voltage on the single summing node when the respective bit differs. When more than half the bits of the data word are switched, the summing node voltage is driven above VDD/2 and a comparator generates an active-high INVERT signal. In another embodiment using a single summing node, one-half of the bits are configured to generate an upward coupling on the summing node when a respective bit differs, and the remaining half of the bits are configured to generate a downward coupling on the summing node when a respective bit matches. The summing node is initialized to a reference voltage such as VDD/2. When more than half the bits of the data word are switched, the summing node is driven above VDD/2 and a comparator generates an active-high INVERT signal. Alternatively, if less than half the bits of the data word differ, the summing node is driven below VDD/2 and the comparator generates an inactive-low INVERT signal. Although a single summing node alternative embodiment is a practical implementation, the split-node capacitive summing circuit 600 advantageously is approximately twice as sensitive as a single summing node circuit. By distributing the respective capacitors 61 8.X over two summing nodes rather than one summing node, each summing node has half the total capacitive load (assuming negligible stray capacitance) and the coupling voltage from each bit results in twice the voltage amplitude on the summing node.

Figure 8:
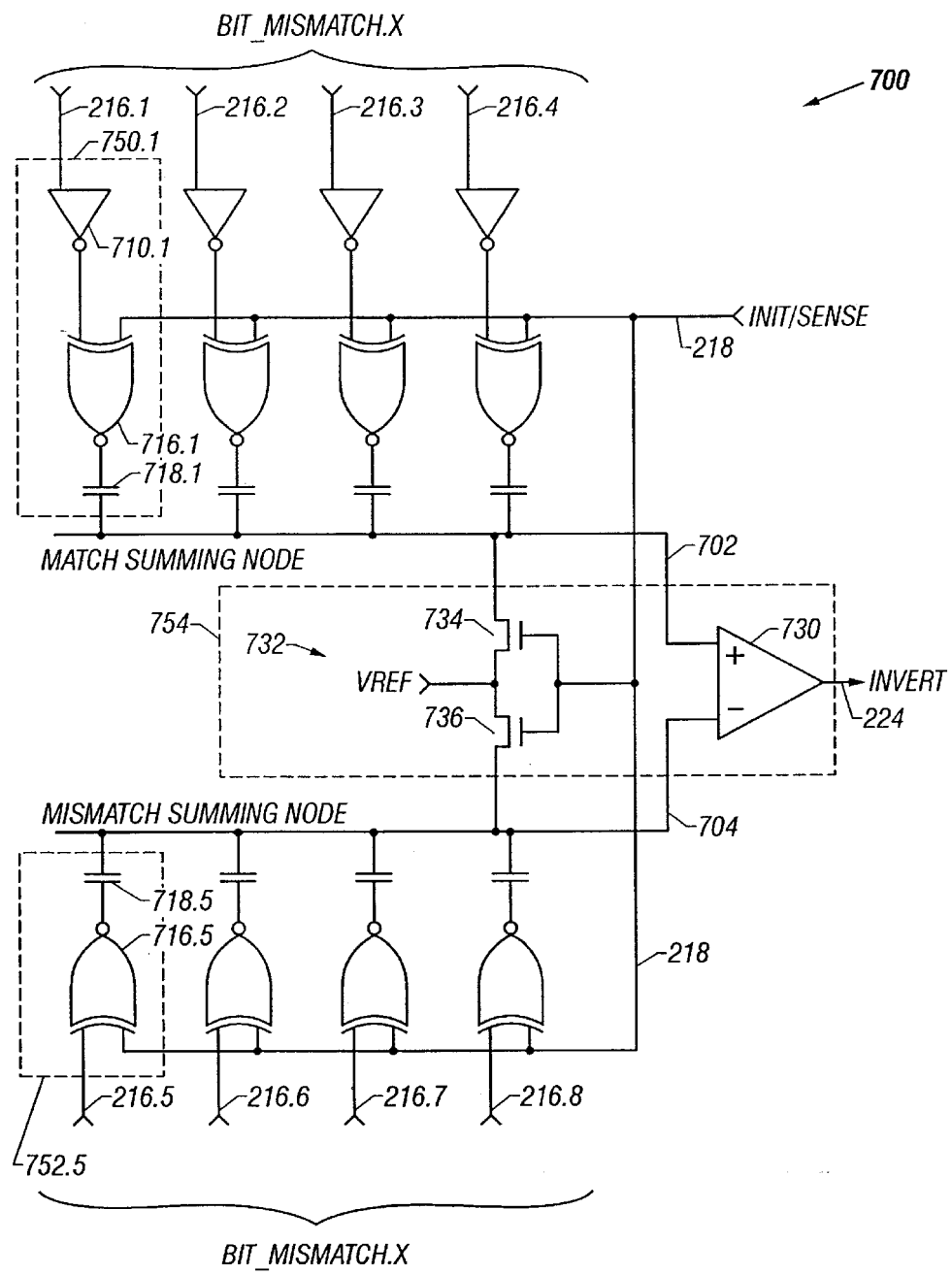
FIG. 8 is a schematic circuit diagram of another analog embodiment of the tally circuit depicted in FIG. 2.

Another embodiment of the tally circuit 230, a split-node capacitive summing circuit 700 with an XOR drive is depicted in a schematic circuit diagram shown in FIG. 8. This embodiment is advantageous for applications in which even greater sensitivity on the summing nodes is sought. One such application occurs when each summing node is connected to a large number of capacitors (e.g., 212 capacitors) that attenuates the incremental voltage attributable to any single capacitor. The split-node capacitive summing circuit 700 differs from the split-node capacitive summing circuit 600 discussed above by replacing the NOR gate 616.X with an XOR gate, by reversing the polarity of the inputs to the differential comparator 630, by reversing the polarity of the match and mismatch summing nodes, and potentially by the choice of a different reference voltage for the equilibration circuit, as are all discussed in detail below.

In operation the split-node capacitive summing circuit 700 functions similarly to the split-node capacitive summing circuit 600. The INIT/SENSE line conveyed on INIT/SENSE line 218 is pulsed every cycle (for each sensing operation) in the split-node capacitive summing circuit 700. The INIT/SENSE signal serves as an initialization line when driven to a logic "1" and serves as a sensing strobe when driven to and held at a logic "0".

The split-node capacitive summing circuit 700 includes two summing nodes, being a match summing node 702 and a mismatch summing node 704, and further includes a differential comparator 730. The differential comparator 730 has a non-inverting input terminal connected to the mismatch summing node 704, an inverting input terminal connected to the match summing node 702, and an output terminal connected to the INVERT signal line 224.

Transistors 734 and 736 together form an equilibration circuit 732 for equilibrating the voltages of the match summing node 702 and the mismatch summing node 704 to a common reference voltage VREF, which advantageously may be VDD/2, although other voltages are suitable, including voltages between and including VSS and VDD. An INIT/SENSE signal is conveyed on an INIT/SENSE line 218 to the gates of N-channel IGFET transistors 734 and 736. The respective source of each transistor is connected to a voltage reference terminal which is in turn connected to receive the reference voltage VREF. The equilibrate circuit 732 and the differential comparator 730 together form an INIT/COMPARE circuit 754.

The match summing node 702 accumulates an incremental signal in a particular direction (e.g., toward a more positive voltage) for each bit of a first portion of bits within the next data word which matches a corresponding bit within the present data word (analogously to the match summing node 604 shown in FIG. 7). In addition, the match summing node 702 also accumulates an incremental signal in direction opposite the particular direction (e.g., toward a more negative voltage) for each bit of the first portion of bits within the next data word which mismatches a corresponding bit within the present data word. In the exemplary embodiment shown in FIG. 8, the first portion of bits is one-half of the bits, and the incremental signal is an incremental voltage signal. Alternatively, the incremental signal may be an incremental current signal. Moreover, as before, the first portion of bits may be configured to be other than one-half of the bits. For example, the first portion may be configured to be approximately one-half of the bits.

For ease of discussion, the split-node capacitive summing circuit 700 shown in FIG. 8 is shown configured for an 8-bit data word. For one half of the bits (being in this example bits 1–4), the BIT_MISMATCH.X signal is sensed and each match results in an additional positive voltage signal accumulated on the match summing node 702, and each mismatch results in an additional negative voltage signal accumulated on the match summing node 702 (as described in detail below). In particular, an urging circuit 750.1 has a first input terminal connected to receive the BIT_MISMATCH.1 signal conveyed on the BIT_MISMATCH bus line 216.1 from the corresponding bit-wise comparison circuit 210.1, has a second input terminal connected to receive the INIT/SENSE signal conveyed on the INIT/SENSE line 218, and has an output terminal connected to the match summing node 702. An identical circuit structure is provided for each of the three remaining other bits. Each of the BIT_MISMATCH bus lines 216.2, 216.3, and 216.4 is coupled to a respective urging circuit 750.2, 750.3, and 750.4 (each identical to urging circuit 750.1) which are all connected to the match summing node 702.

For the other half of the bits (being in this example bits 5–8), the BIT_MISMATCH.X signal is sensed and each mismatch results in an additional positive voltage signal accumulated on the mismatch summing node 704, and each match results in an additional negative voltage signal accumulated on the mismatch summing node 704 (as described in detail below). In particular, an urging circuit 752.5 has a first input terminal connected to receive the BIT_MISMATCH.5 signal conveyed on the BIT_MISMATCH bus line 216.5 from the corresponding bit-wise comparison circuit 210.5, has a second input terminal connected to receive the INIT/SENSE signal conveyed on the INIT/SENSE line 218, and has an output terminal connected to the mismatch summing node 704. An identical circuit structure is provided for each of the three remaining other bits. Each of the BIT_MISMATCH bus lines 216.6, 216.7, and 216.8 is coupled to a respective urging circuit 752.6, 752.7, and 752.8 (each identical to urging circuit 752.5) which are all connected to the mismatch summing node 704.

Each of the urging circuits 750.X coupled to the match summing node 702 includes (for this embodiment) an inverter 710.X, an XOR gate 716.X, and a capacitor 718.X. The input terminal of a respective inverter 710.X is connected to the respective BIT_MISMATCH bus line 216.X. A respective XOR gate 716.X has a first input terminal connected to the output terminal of the respective inverter 710.X, a second input terminal connected to the INIT/SENSE line 218, and an output terminal connected to the first terminal of the respective capacitor 718.X. The second terminal of the respective capacitor 718.X is connected to the match summing node 702.

Each of the urging circuits 752.X coupled to the mismatch summing node 704 is similar but lacks an inverter. Each includes (for this embodiment) an XOR gate 716.X and a capacitor 718.X. A respective XOR gate 716.X has a first input terminal connected to the respective BIT_MISMATCH bus line 216.X, a second input terminal connected to the INIT/SENSE line 218, and an output terminal connected to the first terminal of the respective capacitor 718.X. The second terminal of the respective capacitor 718.X is connected to the mismatch summing node 704.

The operation of the split-node capacitive summing circuit 700 is best understood by initially assuming that the INIT/SENSE signal conveyed on the INIT/SENSE line 218 is high (a logical "1"). The equilibration transistors 734 and 736 are conductive and equilibrate the voltage of the both summing nodes 702 and 704, respectively, to the VREF potential which is, for this example, VDD/2. Because the INIT/SENSE signal is a logic "1" and is received by the second input terminal of each respective XOR gate 716.X, the output terminal of each respective XOR gate 716.X generates the inversion of whatever signal is presented to the first input terminal of the respective XOR gate 716.X. Consequently, the first terminal of each respective capacitor 718.X is held to either a logic "0" or a logic "1" (depending on the logic value of the respective BIT_MISMATCH.X signal) while the second terminal of each respective capacitor 718.X is held to VDD/2 (for this example). A voltage equal to VDD/2 is developed across each of the respective capacitors 718.X, but having a polarity depending on the logic state of the BIT_MISMATCH.X signal received on a respective BIT_MISMATCH bus line 216.X. Here, the logic state of the respective BIT_MISMATCH.X signals does affect the initialization of the split-node capacitive summing circuit 700 embodiment.

When the INIT/SENSE signal is brought to a logic "0", however, each of the respective XOR gates 716.X changes from an "inverter" function to a "pass through" function. The output terminal of each respective XOR gate 716.X is now free to track the logic state of the respective BIT_MISMATCH bus line 216.X. For example, if the BIT_MISMATCH.1 signal conveyed on the BIT_MISMATCH bus line 216.1 is a logic "1" (meaning, for this embodiment, that the first bit within the next data word differs from the corresponding bit within the present data word), the output of respective inverter 710.1 is already low (a logic "0"), and the output of respective XOR gate 716.1 is driven low (to a logic "0") from its previously initialized high value. Since the equilibration transistors 734 and 736 are no longer conductive, the high-to-low transition on the output terminal of the XOR gate 716.1 results in a capacitive coupling of an incremental negative voltage onto the match summing node 702. If, on the other hand, the BIT_MISMATCH.1 signal conveyed on the BIT_MISMATCH bus line 216.1 is a logic "0" (meaning, for this embodiment, that the first bit within the next data word matches the corresponding bit within the present data word), the output of respective inverter 710.1 is already high, and the output of respective XOR gate 716.1 is driven high from its previously initialized low value. The low-to-high transition on the output terminal of the XOR gate 716.1 results in a capacitive coupling of an incremental positive voltage onto the match summing node 702.

In the 8-bit exemplary embodiment of the split-node capacitive summing circuit 700, a group of four bits (bits 1–4, being a portion of the total bits) is associated with the match summing node 702. Each bit within the next data word within this group which differs from a corresponding bit within the present data word results in an incremental negative capacitive coupling onto the match summing node 702. Each bit which matches a corresponding bit within the present data word results in an incremental positive capacitive coupling onto the match summing node 702. If all bits match, the voltage coupled onto the match summing node 702 equals the magnitude of the low-to-high transition on the output terminal of each respective XOR gate 716.X (assuming, of course, that the stray capacitance on the mismatch summing node 702 and the input capacitance of the differential comparator 730 are both negligible). If the initial voltage of the match summing node 702 is VDD/2, and if logic swings of the XOR gates 716.X are "rail-to-rail" voltage swings, then the maximum voltage of match summing node 702 is 3/2·VDD. Alternatively, if all bits mismatch, the voltage coupled onto the match summing node 702 equals the magnitude of the high-to-low transition on the output terminal of each respective XOR gate 716.X. The corresponding minimum voltage of match summing node 702 is then negative VDD/2. The range in voltage of match summing node 702 is consequently 2·VDD.

Consider now the generation of signal on the mismatch summing node 704. When the INIT/SENSE signal is brought to a logic "0", the output terminal of each respective XOR gate 716.X is now free to follow the logic state of the respective BIT_MISMATCH bus line 216.X. For example, if the BIT_MISMATCH.5 signal conveyed on the BIT_MISMATCH bus line 216.5 is a logic "1" (meaning, for this embodiment, that the fifth bit within the next data word differs from the corresponding bit within the present data word), the output of respective XOR gate 716.5 is driven high. This low-to-high transition results in a capacitive coupling of an incremental positive voltage onto the mismatch summing node 704. If, on the other hand, the BIT_MISMATCH signal conveyed on the BIT_MISMATCH bus line 216.5 is a logic "0" (meaning, for this embodiment, that the fifth bit within the next data word matches the corresponding bit within the present data word), the output of respective XOR gate 716.5 is driven low. This high-to-low transition on the output terminal of the XOR gate 716.1 results in a capacitive coupling of an incremental negative voltage onto the mismatch summing node 704.

In the 8-bit exemplary embodiment of the split-node capacitive summing circuit 700, a remaining group of four bits (being bits 5–8) is associated with the mismatch summing node 704. Each bit of the next data word within this remaining group which matches a corresponding bit within the present data word results in an incremental negative capacitive coupling onto the mismatch summing node 704. Conversely, each bit which differs from a corresponding bit within the present data word results in an incremental positive capacitive coupling onto the mismatch summing node 704. If all bits mismatch, the voltage coupled onto the mismatch summing node 704 equals to magnitude of the low-to-high transition on the output terminal of each respective XOR gate 716.X. If the initial voltage of the mismatch summing node 704 is VDD/2, and if logic swings of the XOR gates 716.X are "rail-to-rail" voltage swings, then the maximum voltage of mismatch summing node 704 is 3/2·VDD. Alternatively, if all bits match, the voltage coupled onto the mismatch summing node 704 equals the magnitude of the high-to-low transition on the output terminal of each respective XOR gate 716.X. The corresponding minimum voltage of mismatch summing node 704 is then negative VDD/2. The range in voltage of mismatch summing node 704 is thus also 2·VDD.

The final voltage on the match summing node 702 after sensing depends upon the number of bits, among those bits associated therewith, that match. Similarly, the final voltage on the mismatch summing node 704 after sensing depends upon the number of bits, among those bits associated therewith, that mismatch. The final voltage of either summing node 702 or 704 varies, for this exemplary embodiment, from negative VDD/2 to 3/2·VDD. The differential comparator 730 drives the INVERT signal conveyed on the INVERT signal line 224 to a logic "1" when the voltage of the mismatch summing node 704 exceeds that of the match summing node 702. The INVERT signal becomes valid as soon as resulting summing node voltages are sensed by the differential comparator 730.

The initialization signal INIT/SENSE conveyed on INIT/SENSE line 218 is toggled between every sensing operation because the voltage across each respective capacitor 718.X is initialized as a function of the BIT_MISMATCH.X signal provided on the respective BIT_MISMATCH bus line 216.X.

Because the output of every XOR gate 716.X switches from either low-to-high or from high-to-low, the voltage excursion range of +3/2·VDD to −VDD/2 for the split-node capacitive summing circuit 700 is twice as wide as the voltage excursion range of VDD to 0 for the split-node capacitive summing circuit 600. Accordingly, the split-node capacitive summing circuit 700 is twice as sensitive to a single bit input change. This increase in sensitivity improves signal sensitivity by four times as compared to using a single summing node embodiment of summing circuit 600 (discussed earlier).

As an example, for a VDD power supply voltage of 3.3 volts and for a 424-bit data word, each bit which couples a voltage signal onto match summing node 702 couples a voltage equal to ±3.3/212=±15 mV. The minimum differential signal is then equal to 2·(3.3)/212=30 mV. More specifically, the minimum differential signal voltage between the summing nodes may result when one bit more than half the bits votes to change polarity. The minimum differential signal voltage between the summing nodes may also result when: (1) a number of bits within a first portion of the next data word that differ from the corresponding bit within the present data word (e.g., the bits associated with mismatch summing node 704); and (2) a number of bits within the remaining portion of the next data word that match the corresponding bit within the present data word (e.g., the bits associated with match summing node 702); (3) differ by one bit.

If both summing nodes 702 and 704 are coupled by exactly the same amount (due to the same number of bits coupling each summing node in the same way), then the differential voltage into the differential comparator 730 is zero. Such a situation occurs when exactly half of the bits within the next data word differ from the corresponding bits within the present data word. Clearly, the switching noise is the same whether the next data word or a complement next data word is next driven onto the bus. From a switching noise viewpoint, the output of the differential comparator 730 (the value of the INVERT signal) doesn't matter. What does matter is that the differential comparator 730 decides somewhat promptly one way or the other, or a metastable instability in the sending and receiving circuits otherwise results.

Such a metastable problem, when a differential voltage between the first and second summing nodes approaches zero, may be avoided by choosing a non-zero offset voltage for the differential comparator 730. The non-zero offset voltage is advantageously chosen of a magnitude approximately mid-way between zero and the minimum differential signal voltage (30 mV in this example). A 15 mV offset voltage advantageously reduces problems due to metastable conditions in the differential comparator 730.

Under some conditions, the split-node capacitive summing circuit 700 is advantageous. For example, it is generally advantageous when a very large number of input bits are to be summed or when a large parasitic capacitance on the summing node dilutes the signal effect of each input bit. In other conditions, the split-node capacitive summing circuit 600 provides advantages. It is generally advantageous in conditions where a wider voltage excursion would result in disallowed node voltages for a particular process technology, or when the additional sensitivity provides no operational advantage and a circuit which avoids the complexity of XOR gates is desired.

In many computational applications, analog circuits are disadvantageous due to a lack of precision at high operating speeds. However, in the application of a tally circuit 230, a minor loss of precision is tolerable. For example, if 33 out of 64 data bits differ from one data word to the next, a tally circuit 230 that occasionally and incorrectly counts the number of differing bits as 32 does not affect the precision of data transfer and increases the switching noise by only a few percent. While analog circuits may lack precision, analog circuits do have the compelling advantage that analog circuits are much smaller than digital circuits, particularly when the number of data bits in a data word is large. Accordingly, for large data bit widths, analog implementations of the tally circuit 230 advantageously form compact, high speed circuits.

Other analog embodiments of the tally circuit 230 are possible. One alternative analog circuit sums currents from a set of current mirrors with each mirror being controlled by a respective BIT_MISMATCH signal. Another alternative analog circuit operates using a charge sharing technique in which the charge from a bank of charged capacitors is merged, where each charged capacitor is controlled by one bit of the data word. Still another alternative analog circuit embodiment of the tally circuit 230 employs a resistive network with each resistor controlled by one bit of the data word.

Figure 9:
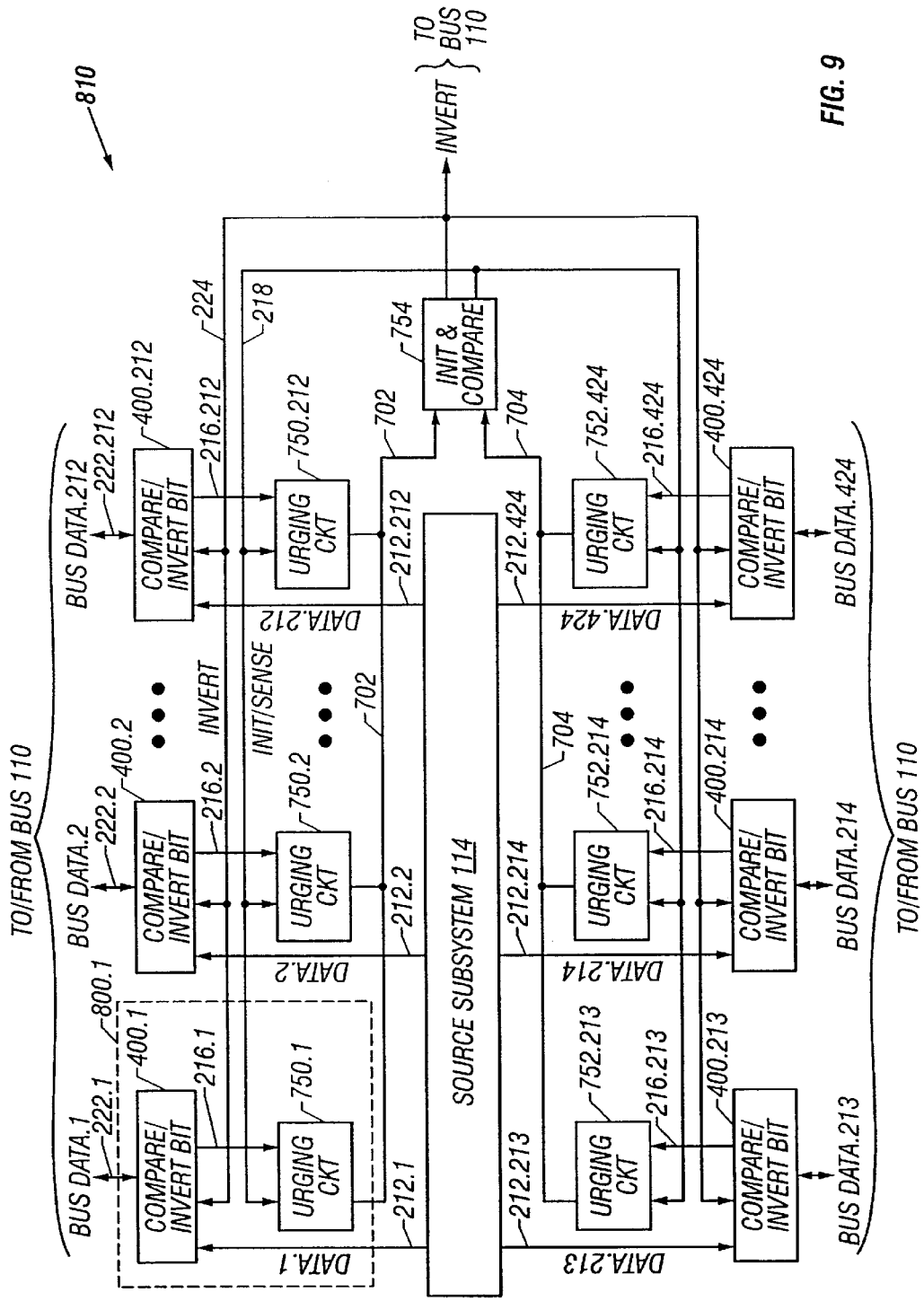
FIG. 9 is a schematic block diagram of an integrated circuit embodiment of the sending circuit depicted in FIG. 2 which utilizes a distributed bit-wise implementation of the tally circuit depicted in FIG. 8.

One of the advantages of using a tally circuit 230 which incorporates a summing node circuit is reduced integrated circuit area which must be allocated to implement the tally circuit 230. FIG. 9 is a block diagram representing an integrated circuit 810 which drives a 424-bit data word onto a 424-bit output bus 110 in accordance with the current invention, and which uses (for the embodiment shown) a split-node capacitive summing circuit 700. The match summing node 702 is routed in close proximity to each of 212 (being one-half of the total number of 424) output circuits 800.1 through 800.212, each analogous to indicated output circuit 800.1. Similarly, the mismatch summing node 704 is routed in close proximity to each of the remaining 212 output circuits 800.213 through 800.424, each also analogous to indicated output circuit 800.1. A respective urging circuit 750.X or 752.X for each bit (analogous to either urging circuit 750.1 or urging circuit 752.5 depicted in FIG. 7) is implemented as part of each respective output circuit 800.X. The INVERT signal conveyed on the INVERT signal line 224 and the INIT/SENSE signal conveyed on the INIT/SENSE line 218 are both routed to each respective output circuit 800.X. Consequently, since the tally circuit 230 is spatially distributed and has a respective portion thereof in close proximity with a respective output circuit for each respective bit of the data word, only three routing channels are required to implement the tally circuit 230 (ignoring clock signals which are usually widely distributed anyway), rather than the large number of channels otherwise required to implement a spatially localized tally circuit 230 (due to routing each BIT_MISMATCH.X signal to a central location).

Figure 10:
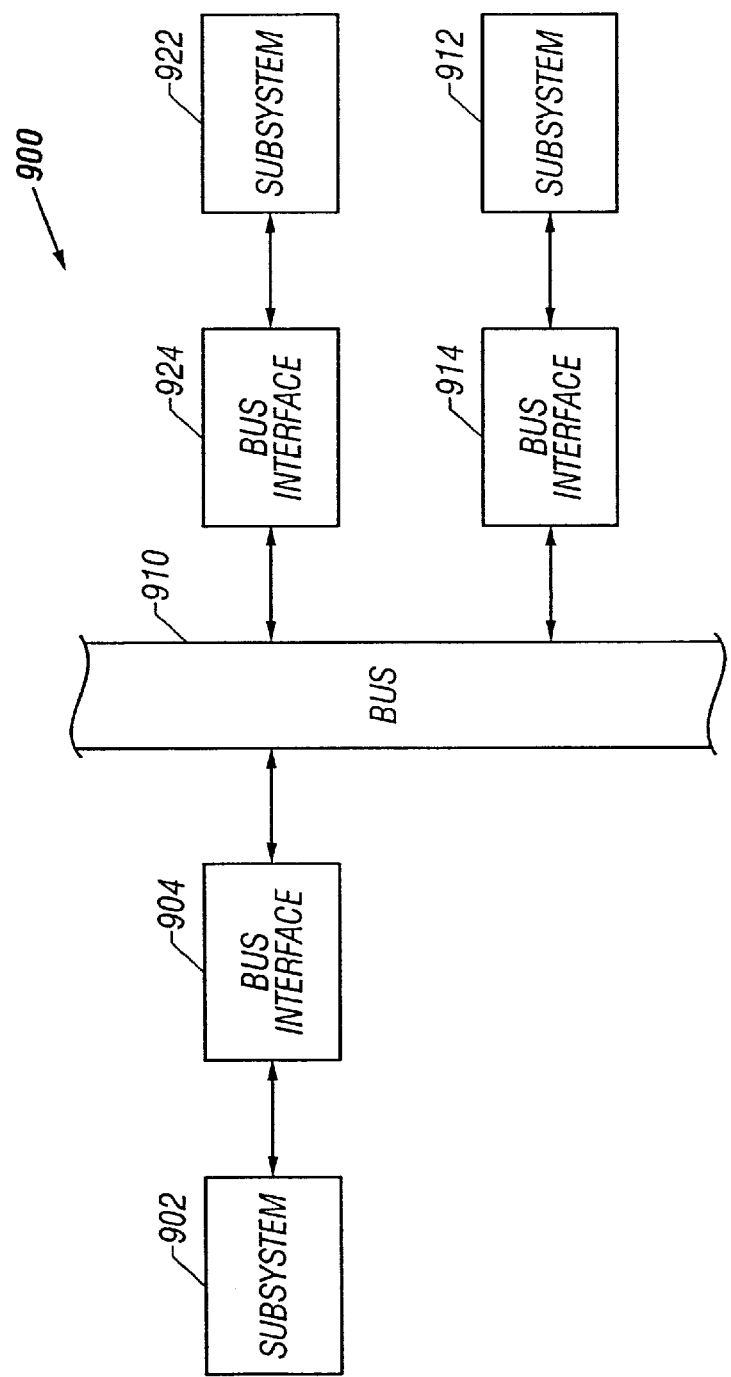
FIG. 10 is a schematic block diagram of a system utilizing several bus interfaces in accordance with the current invention and having a bidirectional system bus.

FIG. 10 depicts a system 900 including three nodes communicating via a bidirectional system bus 910. Each node includes a respective subsystem 902, 912, and 922 and a respective bus interface 904, 914, and 924 in accordance with the current invention. A given subsystem may include both source and destination subsystems (and thus both sending and receiving circuits as described above within its respective bus interface) or may include a plurality of either source and destination subsystems. Alternatively, a particular bus interface may include only a sending or a receiving circuit.

As an example, consider a situation where the present data word on the bus 910 was driven onto the bus 910 by the bus interface 904. Control of the bus 910 passes to bus interface 914, which must drive the very next data word onto the bus 910. Since the respective sending circuit 112 within bus interface 914 compares the next data word to the present data word currently on the bus 910, regardless of which bus interface drove the present data word onto the bus (rather than comparing to the previous data word actually sent by the bus interface 914), the next data word may be communicated onto the bus 910 on the very next bus cycle. It is not necessary to use a bus cycle just to load the present data word into the bus interface 914 for use by its sending circuit 112 for comparison purposes. Control of the bus 910 may change without wasted bus cycles, nor without losing the noise reducing advantages of the current invention for the first word transmitted by a given bus interface after a change in bus control.

While the invention has been described with reference to various embodiments, it will be understood that these embodiments are illustrative and that the scope of the invention is not limited to them. Many variations, modifications, additions and improvements of the embodiments described are possible. For example, a very large output bus may be split into two sub-buses, with a separate polarity control signal (e.g., INVERT signal) for each sub-bus. The grouping of output bits for the two summing nodes of the tally circuit described need not follow any particular order. They may be grouped sequentially, randomly, interleaved (e.g., alternating), or in any other convenient grouping. As an additional example, the inversion function creating the difference between the match summing node and a mismatch summing node may be incorporated in any number of locations and still result in the two summing nodes having opposite polarity. Other types of logic gates, such as NAND gates, may be used instead of the NOR gates depicted in the split-node capacitive summing circuit 600 and the XOR gates depicted in the split-node capacitive summing circuit 700, and still result in analogous or equivalent functionality and the same advantages as those described herein as long as corresponding changes are made in related circuits. The polarity of certain signals, such as the INIT/SENSE signal, the INVERT signal, the BIT_MISMATCH signals, or others may be reversed, or the direction of certain capacitive coupling reversed, or the initialization voltage of the summing nodes altered if corresponding changes are made to related circuits. The complementary output terminal of a particular flip-flop may be used rather than the true (non-inverted) output followed by an inverter or a conditional inverter (i.e., an XOR gate). A complementary signal may be followed by an XNOR gate rather than a true signal followed by an XOR gate. Many alternative embodiments will be evident to one skilled in the art using the teachings of this invention disclosure. Moreover, while the embodiments are described in the context of a data word communicated onto a bus, such a data word need not be restricted to a literal "data" word, as contrasted from an "address" word or a "control" word. Rather, a data word as described herein may refer to any collection of bits communicated from a source subsystem to a destination subsystem in a parallel fashion (i.e., digital word). Also, it will be appreciated that the present data word on the bus described herein refers to the present bus state, irrespective of the polarity form or other coding of an actual digital word that the bus state represents. Consequently, the scope of the invention is not necessarily limited to the embodiments disclosed herein, but is defined by the appended claims.

What is claimed is:

1. A circuit for comparing a first digital word to a second digital word, said circuit comprising:
   a comparison circuit for determining whether each respective bit of the first word differs from a corresponding bit of the second word; and
   a tally circuit coupled to the comparison circuit for determining whether at least a certain number of bits within the first word differ from corresponding bits within the second word, said tally circuit comprising:
      a first summing node for conditionally accumulating a respective incremental capacitively-coupled signal in response to the comparison circuit determining whether a respective bit of a group of bits within the first word differs from a corresponding bit of the second word; and
   a differential comparator having a first input terminal coupled to the first summing node, having a second input terminal, and having an output terminal.

2. A circuit as in claim 1 wherein:
   said first summing node accumulates an incremental capacitively-coupled signal for each bit of the group of bits within the first word which differs from a corresponding bit within the second word.

3. A circuit as in claim 1 wherein:
   said first summing node accumulates an incremental capacitively-coupled signal for each bit of the group of bits within the first word which matches a corresponding bit within the second word.

4. A circuit as in claim 1 wherein, for each respective bit of the first word, the comparison circuit comprises:
   a comparison gate having a first input terminal coupled to receive a respective bit from the first word, having a second input terminal coupled to receive a respective bit from the second word, and having an output terminal coupled to a respective BIT_MISMATCH signal line, said BIT_MISMATCH signal line for indicating whether the respective bit within the first word matches the corresponding bit within the second word.

5. A circuit as in claim 1 wherein, for each respective bit of the first word, the tally circuit further comprises:
   respective means for capacitively-coupling a voltage of the first summing node in a particular direction when a respective bit within the first word differs from a corresponding bit within the second word.

6. A circuit as in claim 5 wherein the particular direction is towards a higher voltage.

7. A circuit as in claim 5 wherein, for each respective bit of the first word, the tally circuit further comprises:
   means for capacitively-coupling a voltage of the first summing node in a direction opposite the particular direction when the respective bit within the first word matches a corresponding bit within the second word.

8. A circuit as in claim 7 wherein a voltage range of the first summing node, in response to the capacitively-coupled signals coupled thereto, approaches a value equal to twice the power supply voltage.

9. A circuit as in claim 1 wherein the second input terminal of the differential comparator is coupled to receive a reference voltage.

10. A circuit as in claim 1 wherein the tally circuit further comprises:
a second summing node, coupled to the second input terminal of the differential comparator, for conditionally accumulating a respective incremental capacitively-coupled signal in response to the comparison circuit determining whether a respective bit other than the group of bits within the first word differs from a corresponding bit of the second word.

11. A circuit for comparing a first digital word to a second digital word, said circuit comprising:
a comparison circuit for determining whether each respective bit of the first word differs from a corresponding bit of the second word; and
a tally circuit coupled to the comparison circuit for determining whether at least a certain number of bits within the first word differ from corresponding bits within the second word, said tally circuit comprising:
a first summing node for accumulating an incremental signal for each bit of a first portion of bits within the first digital word which differs from a corresponding bit within the second digital word;
a second summing node for accumulating an incremental signal for each bit of a remaining portion of bits other than the first portion of bits within the first digital word which matches a corresponding bit within the second digital word; and
a differential comparator for comparing the first summing node with the second summing node.

12. A circuit as in claim 11 wherein the incremental signal comprises an incremental current signal.

13. A circuit as in claim 11 wherein the incremental signal comprises an incremental voltage signal.

14. A circuit as in claim 11 wherein the first portion of bits comprises approximately one-half of the bits forming the first digital word.

15. A circuit as in claim 14 wherein the first portion of bits comprises exactly one-half of the bits forming the first digital word.

16. A circuit as in claim 11 wherein the tally circuit is spatially localized.

17. A circuit as in claim 11 wherein the tally circuit is spatially distributed with a respective portion thereof, including a portion of at least one of the first and second summing nodes, within close proximity to a respective circuit for each respective bit of the first digital word.

18. A circuit as in claim 11:
wherein, for each bit of the first portion of bits within the first digital word, the tally circuit further comprises:
first means responsive to a SENSE signal for urging a voltage of the first summing node in a particular direction when the respective bit within the first digital word differs from a corresponding bit within the second digital word; and
wherein, for each bit of the remaining portion of bits within the first digital word, the tally circuit further comprises:
second means responsive to the SENSE signal for urging a voltage of the second summing node in the particular direction when the respective bit within the first digital word matches a corresponding bit within the second digital word.

19. A circuit as in claim 18 wherein the tally circuit further comprises:
equilibration means for initializing the respective voltages of the first and second summing nodes.

20. A circuit as in claim 19 wherein the equilibration means comprises:
first and second transistors respectively coupling the first and second summing nodes to a reference voltage terminal, said first and second transistors responsive to an EQUILIBRATE signal.

21. A circuit as in claim 20 wherein the reference voltage terminal is coupled to operably receive a voltage within an inclusive range from a first power supply voltage to a second power supply voltage.

22. A circuit as in claim 21 wherein the reference voltage terminal is coupled to operably receive a ground (VSS) potential.

23. A circuit as in claim 18 wherein the differential comparator includes a non-zero offset voltage for reducing metastable operation when a differential voltage between the first and second summing nodes approaches zero.

24. A circuit as in claim 23 wherein the non-zero offset voltage is chosen of a magnitude approximately mid-way between zero and a minimum non-zero differential signal voltage between the first and second summing nodes.

25. A circuit as in claim 24 wherein the minimum non-zero differential signal voltage between the first and second summing nodes corresponds to a differential voltage between the first and second summing nodes which results when:
a number of bits within the first portion of the first digital word that differ from the corresponding bit within the second digital word, and
a number of bits within the remaining portion of the first digital word that match the corresponding bit within the second digital-word;
differ by one bit; and
the first portion and the remaining portion are equal in number.

26. A circuit as in claim 18:
wherein the first means further comprises:
means responsive to the SENSE signal for urging the voltage of the first summing node in a direction opposite the particular direction when the respective bit within the first digital word matches a corresponding bit within the second digital word; and
wherein the second means further comprises:
means responsive to the SENSE signal for urging the voltage of the second summing node in a direction opposite the particular direction when the respective bit within the first digital word differs from a corresponding bit within the second digital word.

27. A circuit as in claim 26 wherein the tally circuit further comprises:
equilibration means for initializing the respective voltages of the first and second summing nodes to a voltage of approximately VDD/2.

28. A circuit as in claim 18:
wherein the first means comprises:
a first kick circuit having a first input terminal coupled to a respective BIT_MISMATCH signal, having a second input terminal coupled to a SENSE signal line, and having an output terminal;

a capacitor coupled between the output terminal of the first kick circuit and the first summing node; and wherein the second means comprises:

a second kick circuit having a first input terminal coupled to a respective BIT_MISMATCH signal, having a second input terminal coupled to the SENSE signal line, and having an output terminal; and a capacitor coupled between the output terminal of the second kick circuit and the second summing node.

29. A circuit as in claim 28 wherein:

the first kick circuit comprises:

an inverter having an input terminal coupled to the first input terminal of the first kick circuit, and having an output terminal;

a first gate circuit having a first input terminal coupled to the output terminal of the inverter, having a second input terminal coupled to the second input terminal of the first kick circuit, and having an output terminal coupled to the output terminal of the first kick circuit; and the second kick circuit comprises:

a second gate circuit having a first input terminal coupled to the first input terminal of the second kick circuit, having a second input terminal coupled to the second input terminal of the second kick circuit, and having an output terminal coupled to the output terminal of the second kick circuit.

30. A circuit as in claim 29 wherein the first and second gate circuits each comprises a gate chosen from the group consisting of a NOR gate, an XOR gate, and a NAND gate.

31. A circuit as in claim 20 wherein the SENSE signal and the EQUILIBRATE signal comprise a single signal.

32. A bus interface circuit for communicating a digital word via a bus, the digital word including a plurality of bits, the bus including a corresponding plurality of individual bus lines, each of the plurality of bus lines having a respective logic state being one of a first and a second state, the plurality of respective bus line logic states collectively representing a bus state, said bus interface circuit including a circuit of claim 17 for comparing a digital word to be next communicated onto the bus against a present bus state.

33. A method for comparing a first digital word with a second digital word to determine whether at least approximately one-half of bits within the first word differ from corresponding bits within the second word, said method comprising the steps of:

providing a first summing node and a second summing node;

dividing the bits forming the first digital word into a first portion of bits and a remaining portion of bits different than the first portion, wherein the first portion and remaining portion are approximately equal in number;

driving a voltage of the first summing node by an incremental amount in a particular direction for each bit of the first portion of bits which differs from a corresponding bit within the second digital word;

driving a voltage of the second summing node by an incremental amount in the particular direction for each bit of the remaining portion of bits which matches a corresponding bit within the second digital word; and comparing a resulting voltage of the first summing node with a resulting voltage of the second summing node.

34. A method as in claim 33 further comprising the steps of:

driving the voltage of the first summing node by an incremental amount in a direction opposite the particular direction for each bit of the first portion of bits which matches the corresponding bit within the second digital word; and driving the voltage of the second summing node by an incremental amount in the direction opposite the particular direction for each bit of the remaining portion of bits which differs from the corresponding bit within the second digital word.

35. A method as in claim 34 wherein:

the incremental amount by which the voltage of the first and second summing node is driven is uniform for each bit compared; and the respective resulting voltage on the first and second summing nodes together form a differential voltage which is a linear function of the number of bits within the first digital word which differ from corresponding bits within the second digital word.

36. A method as in claim 35 wherein each of the first and second summing nodes has a voltage range, in response to the incremental amounts of voltage driven respectively thereunto, which approaches a value equal to 2(VDD).

37. A method as in claim 35 wherein the differential voltage has a range defined at one extreme by a condition in which all bits from the first digital word differ from respective bits within the second digital word, and at another extreme to a condition in which all bits from the first digital word match respective bits within the second digital word, said range extending from +2(VDD) to −2(VDD).

38. A method of communicating a data word via a bus, the data word including a plurality of bits, the bus including a corresponding plurality of individual bus lines for carrying the plurality of bits, each of the plurality of bus lines having first and second states representing binary values of a bit associated therewith, said method comprising the steps of:

driving the data word onto the bus in whichever one of a true polarity form and a complement polarity form that requires fewer bus lines to change state relative to a present state of each bus line;

providing an indicator signal to the bus to indicate which polarity form of the data word is driven onto the bus;

receiving the data word from the bus;

receiving the indicator signal from the bus; and conditionally inverting the polarity form of the data word in response to the indicator signal.

39. A method as in claim 38 wherein the first and second states respectively comprise first and second voltages.

40. A method as in claim 38 wherein the first and second states respectively comprise first and second currents.

41. A digital system including bus interfaces for carrying out the method of claim 38.

42. A method of communicating a data word via a bus, the data word including a plurality of bits, the bus including a corresponding plurality of individual bus lines for carrying the plurality of bits, each of the plurality of bus lines having first and second states representing binary values of a bit associated therewith, said method comprising the steps of:

driving the data word onto the bus in whichever one of a true polarity form and a complement polarity form that requires fewer bus lines to change state relative to a present state of each bus line; and providing an indicator signal to the bus to indicate which polarity form of the data word is driven onto the bus, wherein the first and second states of each respective bus line represent:
respective first and second binary values of an associated bit when the indicator signal is provided in a first state; and
respective second and first binary values of an associated bit when the indicator signal is provided in a second state.

43. A method as in claim 42 wherein both the data word and a present data word corresponding to the present state of each bus line are driven onto the bus by a single bus interface.

44. A method as in claim 42 wherein the data word and a present data word corresponding to the present state of each bus line are driven onto the bus by different bus interfaces.

45. An integrated circuit including a bus interface for carrying out the method of claim 42.

46. An integrated circuit including a bus interface for receiving a data word communicated by the method of claim 42.

47. A digital system comprising:
a system bus;
a digital integrated circuit coupled to the system bus for communicating with portions of the system external to the integrated circuit; and
a subsystem coupled to the system bus;
wherein said system bus is configured to
drive a data word onto the system bus in whichever one of a true polarity form and a complement polarity form that requires fewer bus lines to change state relative to a present state of each bus line;
provide an indicator signal to the bus to indicate which polarity form of the data word is driven onto the bus;
receive the data word from the bus;
receive the indicator signal from the bus; and
conditionally invert the polarity form of the data word in response to the indicator signal.

48. A digital system as in claim 47 wherein the system bus is a bi-directional bus.

49. A bus interface for communicating a data word via a bus, the data word including a plurality of bits, the bus including a corresponding plurality of individual bus lines for carrying the plurality of bits, each of the plurality of bus lines having first and second states representing binary values of a bit associated therewith, said bus interface comprising:
means for driving the data word onto the bus in whichever one of a true polarity form and a complement polarity form that requires fewer bus lines to change state relative to a present state of each bus line;
means for providing an indicator signal to the bus to indicate which polarity form of the data word is driven onto the bus;
means for receiving the data word from the bus;
means for receiving the indicator signal from the bus; and
means for conditionally inverting the polarity form of the data word in response to the indicator signal.

50. A bus interface circuit for communicating a data word via a bus, the data word including a plurality of bits, the bus including a corresponding plurality of individual bus lines for carrying the plurality of bits, each of the plurality of bus lines having first and second states representing binary values of a bit associated therewith, said bus interface comprising:
a sending circuit including:
a determining circuit, responsive to a present data word on the bus and a data word to be next communicated onto the bus, for determining whichever one of the next data word and a complement next data word, if driven onto the bus, requires fewer bus lines to change state relative to the present data word on the bus; and
a polarity circuit for driving the next data word or the complement next data word onto the bus as determined by the determining circuit,
wherein the polarity circuit comprises:
a circuit for conditionally inverting each bit of the next data word to form the complement next data word.

51. A bus interface circuit as in claim 50 wherein the polarity circuit comprises:
a multiplexer circuit for choosing between the data word and the complement next data word.

52. A bus interface circuit as in claim 50 wherein the determining circuit is spatially distributed, having a respective portion thereof in close proximity with a respective output circuit for each respective bit of the data word.

53. A bus interface circuit as in claim 50 wherein the polarity circuit is spatially distributed, having a respective portion thereof in close proximity with a respective output circuit for each respective bit of the data word.

54. A bus interface circuit as in claim 50 further comprising:
a receiving circuit for receiving a data word from the bus, and for reforming a data word upon receiving a complement data word from the bus.

55. A bus interface circuit for communicating a data word via a bus, the data word including a plurality of bits, the bus including a corresponding plurality of individual bus lines for carrying the plurality of bits, each of the plurality of bus lines having first and second states representing binary values of a bit associated therewith, said bus interface comprising:
a sending circuit including:
a determining circuit, responsive to a present data word on the bus and a data word to be next communicated onto the bus, for determining whichever one of the next data word and a complement next data word, if driven onto the bus, requires fewer bus lines to change state relative to the present data word on the bus; and
a polarity circuit for driving the next data word or the complement next data word onto the bus as determined by the determining circuit,
wherein the determining circuit comprises:
a comparison circuit for determining, for each bit of data word to be next communicated onto the bus, whether each bit of the next data word differs from a corresponding bit of the present data word on the bus; and
a tally circuit coupled to the comparison circuit for determining whether at least a certain number of bits within the next data word differ from corresponding bits within the present data word.

56. A bus interface circuit as in claim 55 wherein, for each respective bit of the next data word, the comparison circuit comprises:
a next data storage circuit having an input terminal coupled to receive a respective bit of the next data word, having a clock terminal, and having an output terminal;

a present data storage circuit having an input terminal coupled to receive a respective bit of the present data word on the bus, having a clock terminal, and having an output terminal; and a comparison gate having a first input terminal coupled to the output terminal of the next data storage circuit, a second input terminal coupled to the output terminal of the present data storage circuit, and an output terminal coupled to a respective BIT_MISMATCH signal line, said BIT_MISMATCH signal line for indicating whether the respective bit within the next data word matches the corresponding bit within the present data word.

57. A bus interface circuit as in claim 56 wherein:

the comparison gate comprises an XOR gate;

the next data storage circuit and the present data storage circuit each comprises a D flip-flop; and the clock terminals of the next data storage circuit and the present data storage circuit are coupled to receive a system clock signal.

58. A bus interface circuit as in claim 56 wherein, for each respective bit of the next data word, the polarity circuit includes:

an inversion gate having a first input terminal coupled to the output terminal of the respective next data storage circuit, having a second input terminal coupled to receive a POLARITY_CONTROL signal line from the tally circuit, and having an output terminal, the POLARITY CONTROL signal line being indicative of when at least the certain number of bits within the next data word differ from corresponding bits of the present data word; and an output data storage circuit having an input terminal coupled to the output terminal of the inversion gate, having a clock terminal, and having an output terminal coupled to a respective bus line of the bus.

59. A bus interface circuit as in claim 58 wherein:

the inversion gate comprises an XOR gate;

the output storage circuit comprises a D flip-flop; and the clock terminal of the output storage circuit is coupled to receive a complement system clock signal.

60. A bus interface circuit as in claim 55 wherein the tally circuit comprises:

a digital adder circuit for determining a total number of bits within the next data word which differ from respective bits within the present data word;

a reference circuit for generating a reference digital number; and a numerical comparator circuit for comparing the total number of bits which differ against the reference digital number, and for generating a POLARITY_CONTROL signal accordingly.

61. A bus interface circuit as in claim 55 wherein the tally circuit comprises:

a summing node for accumulating an incremental signal for each bit within the next data word which differs from a corresponding bit within the present data word; and a differential comparator having a first input terminal coupled to the summing node, having a second input terminal, and having an output terminal coupled to a POLARITY_CONTROL signal line.

62. A bus interface circuit as in claim 61 wherein the tally circuit further comprises:

respective means for urging a voltage of the summing node in a particular direction when a respective bit within the next data word differs from a corresponding bit within the present data word.

63. A bus interface circuit as in claim 62 wherein the particular direction is towards a higher voltage.

64. A bus interface circuit as in claim 62 wherein the tally circuit further comprises:

means for urging a voltage of the summing node in a direction opposite the particular direction when the respective bit within the next data word matches a corresponding bit within the present data word.

65. A bus interface circuit as in claim 61 wherein the second input terminal of the differential comparator is coupled to a reference voltage terminal.

66. A bus interface circuit as in claim 55 wherein the tally circuit comprises:

a first summing node for accumulating an incremental signal for each bit of a first portion of bits within the next data word which differs from a corresponding bit within the present data word;

a second summing node for accumulating an incremental signal for each bit of a remaining portion of bits other than the first portion of bits within the next data word which matches a corresponding bit within the present data word; and a differential comparator having a first input terminal coupled to the first summing node, having a second input terminal coupled to the second summing node, and having an output terminal coupled to a POLARITY_CONTROL signal line.

67. A bus interface circuit as in claim 66 wherein the incremental signal comprises an incremental current signal.

68. A bus interface circuit as in claim 66 wherein the incremental signal comprises an incremental voltage signal.

69. A bus interface circuit as in claim 66 wherein the first portion of bits comprises approximately one-half of the bits forming the data word.

70. A bus interface circuit as in claim 66 wherein the first portion of bits comprises one-half of the bits forming the data word.

71. A bus interface circuit as in claim 66 wherein the tally circuit is spatially localized.

72. A bus interface circuit as in claim 66 wherein the tally circuit is spatially distributed with a respective portion thereof, including a portion of one of the first and second summing nodes, within close proximity to a respective output circuit for each respective bit of the data word.

73. A bus interface circuit as in claim 66:

wherein, for each bit of the first portion of bits within the next data word, the tally circuit further comprises:

first means responsive to a SENSE signal for urging a voltage of the first summing node in a particular direction when the respective bit within the next data word differs from a corresponding bit within the present data word; and wherein, for each bit of the remaining portion of bits within the next data word, the tally circuit further comprises:

second means responsive to the SENSE signal for urging a voltage of the second summing node in the particular direction when the respective bit within the next data word matches a corresponding bit within the present data word.

74. A bus interface circuit as in claim 73:

wherein the first means further comprises:

means responsive to the SENSE signal for urging the voltage of the first summing node in a direction opposite the particular direction when the respective bit within the next data word matches a corresponding bit within the present data word; and wherein the second means further comprises:
means responsive to the SENSE signal for urging the voltage of the second summing node in a direction opposite the particular direction when the respective bit within the next data word differs from a corresponding bit within the present data word.

75. A bus interface circuit as in claim 73:
wherein the first means comprises:
a first kick circuit having a first input terminal coupled to a respective BIT_MISMATCH signal, having a second input terminal coupled to a SENSE signal line, and having an output terminal;
a capacitor coupled between the output terminal of the first kick circuit and the first summing node; and wherein the second means comprises:
a second kick circuit having a first input terminal coupled to a respective BIT_MISMATCH signal, having a second input terminal coupled to the SENSE signal line, and having an output terminal; and
a capacitor coupled between the output terminal of the second kick circuit and
the second summing node.

76. A bus interface circuit as in claim 75 wherein the tally circuit further comprises:
equilibration means for initializing the respective voltages of the first and second summing nodes.

77. A bus interface circuit as in claim 76 wherein the equilibration means comprises:
first and second transistors respectively coupling the first and second summing nodes to a reference voltage terminal, said first and second transistors responsive to an EQUILIBRATE signal.

78. A bus interface circuit as in claim 77 wherein the reference voltage terminal is coupled to operably receive a voltage within an inclusive range from a first power supply voltage to a second power supply voltage.

79. A bus interface circuit as in claim 78 wherein the reference voltage terminal is coupled to operably receive a ground (VSS) potential.

80. A bus interface circuit as in claim 75 wherein:
the first kick circuit comprises:
an inverter having an input terminal coupled to the first input terminal of the first kick circuit, and having an output terminal;
a first gate circuit having a first input terminal coupled to the output terminal of the inverter, having a second input terminal coupled to the second input terminal of the first kick circuit, and having an output terminal coupled to the output terminal of the first kick circuit; and the second kick circuit comprises:
a second gate circuit having a first input terminal coupled to the first input terminal of the second kick circuit, having a second input terminal coupled to the second input terminal of the second kick circuit, and having an output- terminal coupled to the output terminal of the second kick circuit.

81. A bus interface circuit as in claim 80 wherein the first and second gate circuits each comprises:
a NOR gate.

82. A bus interface circuit as in claim 80 wherein the first and second gate circuits each comprises:
an XOR gate.

83. A bus interface circuit as in claim 77 wherein the SENSE signal and the EQUILIBRATE signal comprise a single signal.

84. A bus interface circuit as in claim 73 wherein the differential comparator includes a non-zero offset voltage for reducing metastable operation when a differential voltage between the first and second summing nodes approaches zero.

85. A bus interface circuit as in claim 84 wherein the non-zero offset voltage is chosen of a magnitude approximately mid-way between zero and a minimum differential signal voltage, said minimum differential signal voltage corresponding to a differential voltage between the first and second summing nodes which results when:
a number of bits within the first portion of the next data word that differ from the corresponding bit within the present data word, and
a number of bits within the remaining portion of the next data word that match the corresponding bit within the present data word;
differ by one bit.

86. A bus interface circuit as in claim 85 wherein, for each respective bit of the next data word, the receiving circuit further comprises:
a receive XOR gate having a first input terminal coupled to a respective bus line to receive a respective bit of a data word from the bus, having a second input terminal coupled to receive an indicator signal from the bus, and having an output terminal.

87. A bus interface circuit for communicating a multi-bit data word via a bus, comprising:
a sending circuit comprising:
a comparison circuit for determining, for each bit of a data word to be next communicated onto the bus, whether each bit of the next data word has the same data state or a different data state compared to a corresponding bit of a data word that is currently on the bus;
a tally circuit coupled to the comparison circuit for determining whether at least a certain number of bits within the next data word differ in data state compared to corresponding bits of the current data word; and
an inversion circuit coupled to the tally circuit and to the bus, the inversion circuit for conditionally inverting each bit of the next data word to form a complement next data word when at least the certain number of bits within the next data word differ in data state compared to corresponding bits of the current data word and for providing the complement next data word to the bus, and otherwise for providing the next data word to the bus.

88. A bus interface circuit as in claim 87 further comprising:
a receiving circuit for receiving a data word from the bus, and for reforming the data word upon receipt from the bus of a data word which is a complement data word.

* * * * *